(12) United States Patent
Yamada et al.

(10) Patent No.: US 7,256,125 B2
(45) Date of Patent: Aug. 14, 2007

(54) METHOD OF MANUFACTURING A SEMICONDUCTOR DEVICE

(75) Inventors: Kentaro Yamada, Hitachi (JP); Masato Takahashi, Mito (JP); Tatsuyuki Konagaya, Hitachinaka (JP); Takeshi Katoh, Hitachinaka (JP); Masaki Sakashita, Mito (JP); Koichiro Takei, Hitachinaka (JP); Yasuhiro Obara, Hitachinaka (JP); Yoshio Fukayama, Ichinomiya (JP)

(73) Assignee: Renesas Technology Corp., Tokyo (JP)

( * ) Notice: Subject to any disclaimer, the term of this patent is extended or adjusted under 35 U.S.C. 154(b) by 291 days.

(21) Appl. No.: 10/923,045

(22) Filed: Aug. 23, 2004

(65) Prior Publication Data

US 2005/0048708 A1    Mar. 3, 2005

(30) Foreign Application Priority Data

Aug. 25, 2003  (JP)  ............................. 2003-299793

(51) Int. Cl.
*H01L 21/44* (2006.01)
*H01L 21/4763* (2006.01)
*H01L 21/336* (2006.01)

(52) U.S. Cl. .................... 438/683; 438/305; 438/592; 438/649; 438/660; 438/659; 438/585; 438/586; 257/E21.2; 257/E21.13; 257/E21.203; 257/E21.204

(58) Field of Classification Search ................ 438/683, 438/656, 649, 659, 660, 585, 592, 586; 257/E21.2, 257/E21.13, E21.203, E21.204

See application file for complete search history.

(56) References Cited

U.S. PATENT DOCUMENTS 6,294,435 B1 *   9/2001  Chu et al. ................... 438/305
7,078,342 B1 *   7/2006  Pan et al. ................... 438/683
2001/0008796 A1 * 7/2001  Matsudo et al. ............ 438/652

FOREIGN PATENT DOCUMENTS

JP        05-343352       12/1993
JP        07-078991        3/1995

* cited by examiner

*Primary Examiner*—Walter Lindsay, Jr.
(74) *Attorney, Agent, or Firm*—Antonelli, Terry, Stout & Kraus, LLP.

(57) ABSTRACT

For improving the reliability of a semiconductor device having a stacked structure of a polycrystalline silicon film and a tungsten silicide film, the device is manufactured by forming a polycrystalline silicon film, a tungsten silicide film and an insulating film successively over a gate insulating film disposed over the main surface of a semiconductor substrate, and patterning them to form a gate electrode having a stacked structure consisting of the polycrystalline silicon film and tungsten silicide film. The polycrystalline silicon film has two regions, one region formed by an impurity-doped polycrystalline silicon and the other one formed by non-doped polycrystalline silicon. The tungsten silicide film is deposited so that the resistivity of it upon film formation would exceed 1000 μΩcm.

18 Claims, 26 Drawing Sheets

METHOD OF MANUFACTURING A SEMICONDUCTOR DEVICE

CROSS-REFERENCE TO RELATED APPLICATION

The present application claims priority from Japanese Patent application JP 2003-299793, filed on Aug. 25, 2003, the content of which is hereby incorporated by reference into this application.

BACKGROUND OF THE INVENTION

The present invention relates to a technique for use in the manufacture of a semiconductor device; and, more particularly, the invention relates to a technique that is effective when applied to the manufacture of a semiconductor device which is equipped with a MISFET (Metal Insulator Semiconductor Field Effect Transistor) having a gate electrode obtained by stacking a polycrystalline silicon film and a tungsten silicide film one after another.

A gate electrode having a stacked structure consisting of a polycrystalline silicon film and a tungsten silicide film is formed by forming a gate insulating film over a semiconductor substrate, forming thereover a polycrystalline silicon film and a tungsten silicide film successively and then patterning this film stack.

Japanese Unexamined Patent Publication No. Hei 7(1995)-78991 describes a fabrication technique for use in the manufacture of a semiconductor device having a tungsten polycide film by stacking a tungsten silicide film over a polycrystalline silicon film, wherein the tungsten silicide film has a high silicon content portion in the vicinity of the interface with the polycrystalline silicon film, a low silicon content portion at the center and a high silicon content portion in the vicinity of the surface (refer to Patent Document 1).

Japanese Unexamined Patent Publication No. Hei 5(1993)-343352 describes a technique of forming a polycrystalline silicon film over a gate oxide film and depositing a $WSi_x$ film thereover through a seed layer, such as a thin polycrystalline silicon film, whereby, owing to a natural oxide film on the surface of the polycrystalline silicon film buried inside, the interface with the $WSi_x$ film becomes ideal, the $WSi_x$ film has improved adhesion and a lowering of the resistance of the polycide can be attained (refer to Patent Document 2).

[Patent Document 1] Japanese Unexamined Patent Publication No. Hei 7(1995)-78991

[Patent Document 2] Japanese Unexamined Patent Publication No. Hei 5(1993)-343352

SUMMARY OF THE INVENTION

According to an investigation, the present inventors have found that the above-described techniques have problems, as will be described below.

When a gate electrode formed by patterning a polycrystalline silicon film and a tungsten silicide film that are stacked over a gate insulating film disposed over a semiconductor substrate is subjected to heat treatment (light oxidation) in an oxygen atmosphere, oxidation of tungsten in the tungsten silicide film is likely to occur on the sidewalls of the gate electrode. This oxidation of tungsten on the sidewalls of the gate electrode may lower the dielectric breakdown resistance of the gate insulating film and, in turn, lower the reliability of the semiconductor device.

An object of the present invention is to provide a method of manufacture of a semiconductor device having improved reliability.

The above-described and the other objects and novel features of the present invention will become apparent from the following description herein and the accompanying drawings.

Of the aspects and features of the invention disclosed in the present application, typical ones will be outlined briefly.

In one aspect of the present invention, there is thus a method of manufacturing a semiconductor device, which comprises forming a polycrystalline silicon film disposed over an insulating film over a semiconductor substrate while controlling the impurity concentration of the polycrystalline silicon film so that it is lower in a region near the upper surface than in an inside region, forming a metal silicide film over the polycrystalline silicon film, patterning these films and then heat treating the patterned films.

In another aspect of the present invention, there is also a method of manufacturing a semiconductor device, which comprises forming a first polycrystalline silicon film, a second polycrystalline silicon film having a lower impurity concentration than that of the first polycrystalline silicon film and a metal silicide film successively, patterning these films and then heat treating the patterned films.

In a further aspect of the present invention, there is also a method of manufacture of the present invention as described above, wherein the resistivity of the metal silicide film is 1000 $\mu\Omega$cm or greater upon deposition and 400 $\mu\Omega$cm or less after the heat treatment.

Advantages available by the adopting the invention disclosed in the present application are as follows.

A semiconductor device having an improved performance can be obtained.

A semiconductor device having more improved electrical properties and improved reliability can be obtained.

A semiconductor device can be produced at an improved yield.

DETAILED DESCRIPTION OF THE PREFERRED EMBODIMENTS

Figure 1:
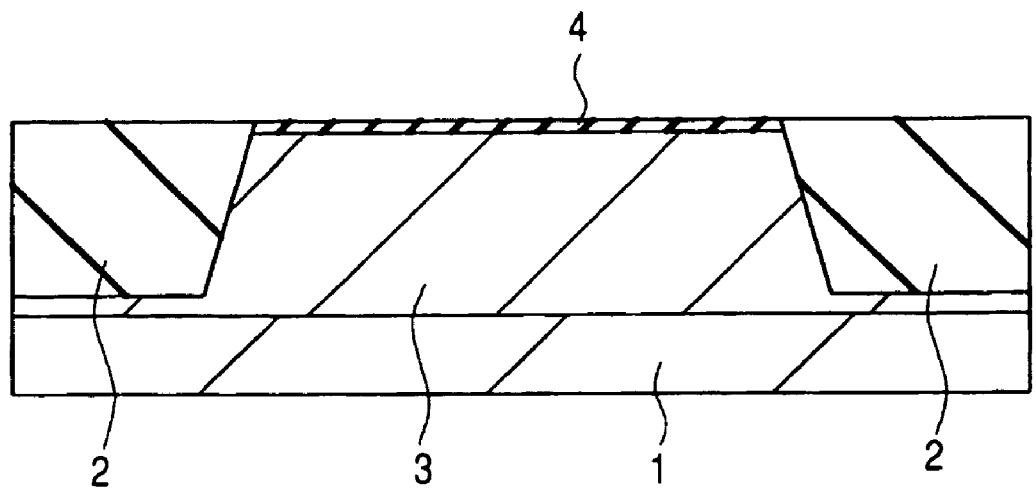
FIG. 1 is a fragmentary cross-sectional view of a semiconductor device according to one embodiment of the present invention during a manufacturing step thereof.

Embodiments of the present invention will be described specifically with reference to the accompanying drawings. In all of the drawings, elements having like function will be identified by like reference numerals and overlapping descriptions will be omitted. In the description of the embodiments, a description of the same or a similar portion is not repeated in principle unless otherwise particularly necessary.

In the drawings, hatching is sometimes omitted even from a cross-sectional view to facilitate an understanding of the subject application. On the other hand, hatching is sometimes given to a plan view to facilitate observation of certain elements.

Embodiment 1

Figure 2:
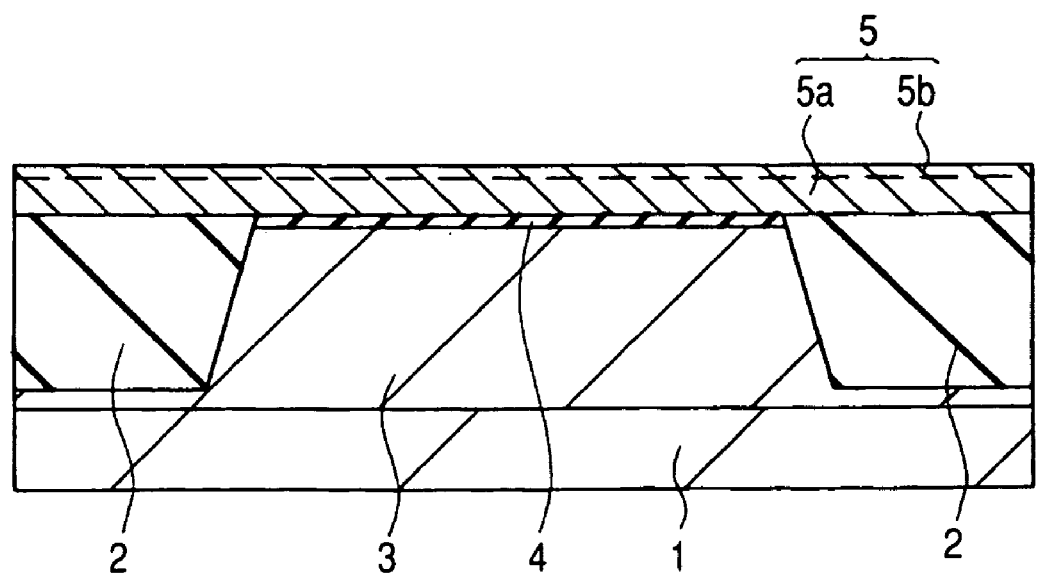
FIG. 2 is a fragmentary cross-sectional view of the semiconductor device during a manufacturing step following that of FIG. 1.

A method of manufacture of a semiconductor device according to this Embodiment will be described with reference to the drawings. FIGS. 1 and 2 are fragmentary cross-sectional views of a semiconductor device according to one embodiment of the present invention, for example, a MISFET (Metal Insulator Semiconductor Field Effect Transistor), during its manufacture.

As illustrated in FIG. 1, an element isolation region 2 is formed over the main surface of a semiconductor substrate (semiconductor wafer) 1 made of p type single crystal silicon having a specific resistance of about 1 to 10 Ωcm. The element isolation region 2 is made of silicon oxide and is formed, for example, by the STI (Shallow Trench Isolation) or LOCOS (Local Oxidization of Silicon) method. In this Embodiment, the STI method is employed for the formation of the element isolation region. In other words, the element isolation region 2 is formed by embedding a silicon oxide film in a trench formed in the semiconductor substrate 1.

A p well 3 is then formed in a region of the semiconductor substrate 1 in which an n channel MISFET is to be formed. The p well 3 is formed for example by ion implantation of an impurity such as boron (B).

A gate insulating film 4 is then formed over the surface of the p well 3. The gate insulating film 4 is made of, for example, a thin silicon oxide film and can be formed, for example, by thermal oxidation method.

As illustrated in FIG. 2, a polycrystalline silicon film 5 is formed over the semiconductor substrate 1, more specifically, the gate insulating film 4. The polycrystalline silicon film 5 can be formed, for example, by CVD.

Figure 3:
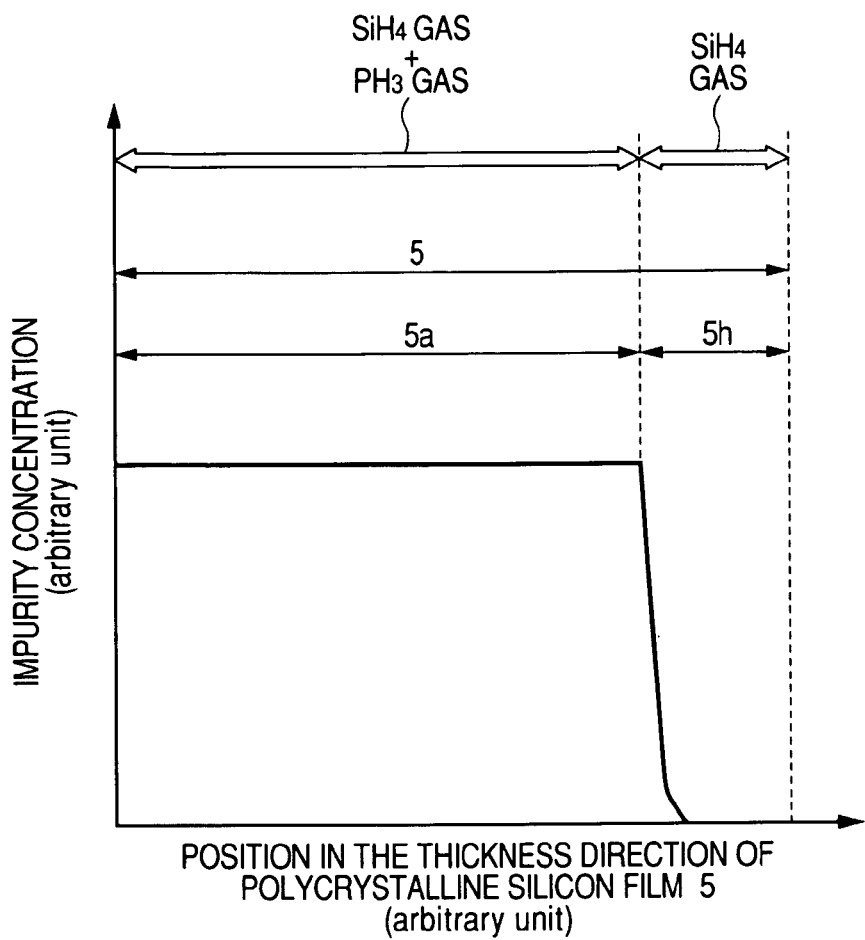
FIG. 3 is a graph showing the impurity concentration distribution of a polycrystalline silicon film in its thickness direction.
Figure 4:
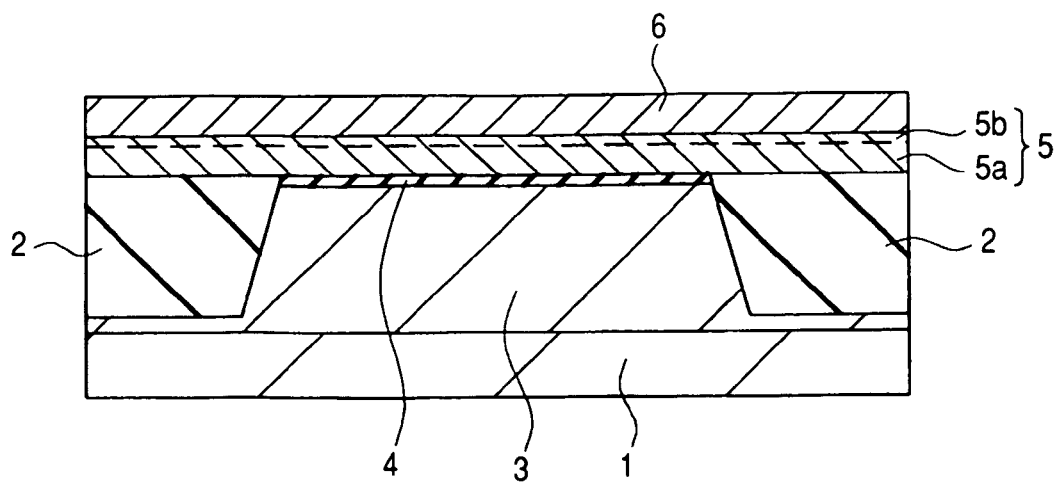
FIG. 4 is a fragmentary cross-sectional view of the semiconductor device during a manufacturing step following that of FIG. 2.

FIG. 3 is a graph diagrammatically showing the impurity concentration distribution, in the thickness direction (a direction vertical to the main surface of the semiconductor substrate 1), of the polycrystalline silicon film 5 thus formed by deposition. In the graph of FIG. 3, the abscissa corresponds to a position (arbitrary unit) in the thickness (film thickness) direction of the polycrystalline silicon film 5 from its lower surface to which the gate insulating film 4 is adjacent to its upper surface, while the ordinate corresponds to an impurity concentration (arbitrary unit), meaning the concentration of phosphorus (P) in this graph, in the polycrystalline silicon film 5. The graph of FIG. 3 also indicates the kind of gas introduced into a film forming apparatus upon formation of the polycrystalline silicon film 5.

As can be seen from FIG. 3, the formation of the polycrystalline silicon film 5 in the initial stage is carried out by introducing monosilane ($SiH_4$) and phosphine ($PH_3$) gases into a film forming apparatus (for example, CVD apparatus) so as to introduce an impurity (for example, phosphorus (P)) into the polycrystalline silicon film 5. When the polycrystalline silicon film 5 gains a predetermined thickness (corresponding to a polycrystalline silicon area 5a), introduction of the phosphine ($PH_3$) gas into the film forming apparatus is terminated and introduction of only the monosilane ($SiH_4$) gas as the film forming gas is continued. The polycrystalline silicon film 5 (corresponding to a polycrystalline silicon area 5b) is thus formed without introducing an impurity (for example, phosphorus (P)) into the polycrystalline silicon film 5.

In such a manner, the polycrystalline silicon film 5 composed of the polycrystalline silicon area (doped polycrystalline silicon area) 5a having a relatively high impurity concentration, which has been formed while introducing the monosilane ($SiH_4$) and phosphine ($PH_3$) gases, and, over the region 5a, the polycrystalline silicon area (undoped or nondoped polycrystalline silicon area) 5b having a relatively lower impurity concentration than the polycrystalline silicon area 5a, which has been formed after termination of the introduction of the phosphine ($PH_3$) gas, is formed as illustrated in FIG. 3. The time spent for forming the polycrystalline silicon area 5a while introducing the monosilane ($SiH_4$) and phosphine ($PH_3$) gases is, for example, about 10 minutes, while the time spent for forming the polycrystalline silicon area 5b while not introducing the phosphine ($PH_3$) gas, but introducing only the monosilane ($SiH_4$) gas, is, for example, about 1 minute. The polycrystalline silicon area 5a has a thickness (thickness in the direction vertical to the main surface of the semiconductor substrate 1, deposition thickness), for example, of about 50 nm, and the thickness of the polycrystalline silicon area 5b (thickness in the direction vertical to the main surface of the semiconductor substrate 1, deposition thickness) is, for example, about several nm.

As illustrated in FIG. 3, the impurity concentration in the polycrystalline silicon area 5b which corresponds to a surface layer or upper layer portion (a region of the polycrystalline silicon film 5 in the vicinity of its upper surface) of the polycrystalline silicon film 5 is smaller than that in the polycrystalline silicon area 5a which corresponds to the lower layer (that is, a region of the polycrystalline silicon film 5 in the vicinity its the lower surface) and inside region (that is, a region inner than the polycrystalline silicon area 5b) of the polycrystalline silicon film 5. Even when the introduction of the phosphine ($PH_3$) gas into the film forming apparatus is terminated, the phosphine ($PH_3$) gas remains in the film forming chamber and the concentration of the phosphine ($PH_3$) gas in the gas forming chamber lowers gradually due to the gas exhaustion. The impurity concentration of the polycrystalline silicon film therefore does not become zero immediately after the termination of the introduction of the phosphine ($PH_3$) gas, but gradually lowers, and, in the end, a polycrystalline silicon film having substantially no impurity introduced therein (non-doped film) is formed. In this Embodiment, it is preferred to control the impurity concentration in the upper layer portion (corresponding to the polycrystalline silicon area 5b) of the polycrystalline silicon film 5 to be smaller than that in the lower layer and inside region (corresponding to the polycrystalline silicon area 5a) of the polycrystalline silicon film 5, more preferably, to constitute the lower layer and inside region (corresponding to the polycrystalline silicon area 5a) of the polycrystalline silicon film 5 from polycrystalline silicon doped with an impurity (doped polycrystalline silicon) and the upper layer portion (corresponding to the polycrystalline silicon area 5b) of the polycrystalline silicon film 5 from polycrystalline silicon having no impurity introduced therein (non-doped polycrystalline silicon).

FIGS. 4 to 11 are fragmentary cross-sectional views of the semiconductor device as seen in the manufacturing steps following that of FIG. 2.

After formation of the polycrystalline silicon film 5 in the above-described manner, a tungsten silicide ($W_xSi_y$) film 6 is formed as a metal silicide film (refractory metal silicide film) over the semiconductor substrate 1, more specifically, over the polycrystalline silicon film 5. The tungsten silicide film 6 can be formed, for example, by CVD. Alternatively, the tungsten silicide film 6 can be formed by sputtering.

In this Embodiment, a tungsten silicide film ($W_xSi_y$ film, $W_xSi_y$ layer) 6 which is relatively rich in Si is formed. The resistivity of the tungsten silicide film 6 becomes greater with an increase in the Si ratio (that is, y/x of $W_xSi_y$) of the tungsten silicide film 6. Accordingly, the Si ratio (that is, y/x of $W_xSi_y$) of the tungsten silicide film 6 can be controlled by adjustment of the resistivity of the tungsten silicide film 6 upon deposition or film formation (as-deposition). In this Embodiment, the tungsten silicide film 6 is formed so that the resistivity of the tungsten silicide film 6 upon deposition or film formation (as-deposition) would exceed 1000 μΩcm. This makes it possible to adjust the Si ratio (that is, y/x of $W_xSi_y$) of the tungsten silicide film 6 to be relatively large. More specifically, the tungsten silicide film ($W_xSi_y$ film) 6 is formed so that a ratio (composition ratio) of $W_xSi_y$ would satisfy y/x≧2.

The Si ratio of the tungsten suicide film 6 can be controlled, for example, by adjusting the flow rate of a gas introduced into the film forming apparatus (for example, CVD apparatus). Upon formation of the tungsten silicide film 6, tungsten hexafluoride (WF$_6$) and dichlorosilane (SiH$_2$Cl$_2$) gases are introduced into the film forming apparatus. The Si ratio of the tungsten silicide film 6 thus formed is relatively lowered in response to an increase in the flow rate of the tungsten hexafluoride (WF$_6$) gas (or a decrease in the flow rate of the dichlorosilane (SiH$_2$Cl$_2$) gas), while the Si ratio of the tungsten silicide film 6 thus formed is relatively heightened by a decrease in the flow rate of the tungsten hexafluoride (WF$_6$) gas (or an increase in the flow rate of the dichlorosilane (SiH$_2$Cl$_2$) gas). In addition to the tungsten hexafluoride (WF$_6$) gas and dichlorosilane (SiH$_2$Cl$_2$) gas, an argon (Ar) gas can be introduced as a diluting gas or carrier gas upon formation of the tungsten silicide film 6. The tungsten suicide film 6 can be formed, for example, under the following conditions: the temperature of the semiconductor substrate 1 disposed in the film forming chamber of the film forming apparatus at about 565° C., the pressure in the film forming chamber under about 100 Pa, and the flow rates of the tungsten hexafluoride (WF$_6$) gas, dichlorosilane (SiH$_2$Cl$_2$) gas and the argon (Ar) gas introduced into the film forming chamber at 2.6 sccm (standard cubic centimeters per minute), 150 sccm and 380 sccm, respectively.

Figure 5:
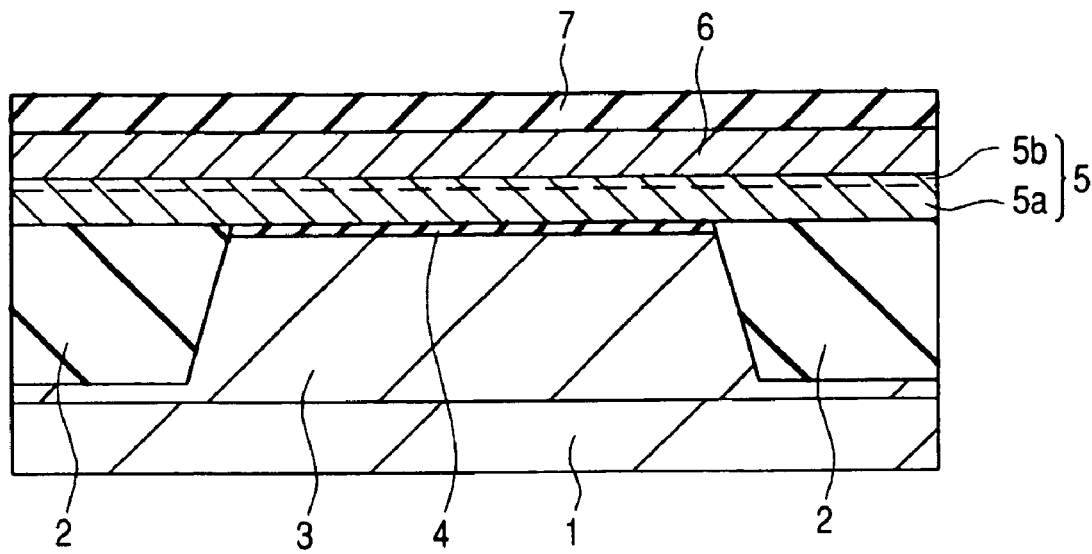
FIG. 5 is a fragmentary cross-sectional view of the semiconductor device during a manufacturing step following that of FIG. 4.

After formation of the tungsten silicide film 6 in the above-described manner, an insulating film 7 made of a protecting film such as a silicon oxide film (for example, TEOS (tetraethoxysilane) oxide film) is formed over the semiconductor substrate 1, more specifically, the tungsten silicide film 6, as illustrated in FIG. 5.

Figure 6:
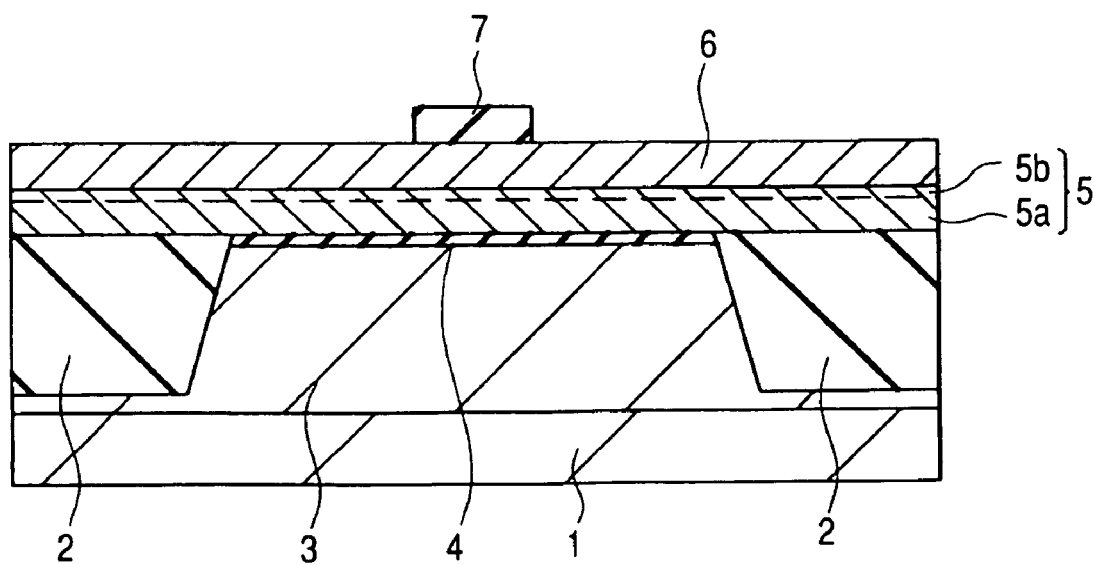
FIG. 6 is a fragmentary cross-sectional view of the semiconductor device during a manufacturing step following that of FIG. 5.

A photoresist film (not illustrated) is formed over the semiconductor substrate 1, more specifically, the insulating film 7, followed by exposure and development of the photoresist film, whereby a photoresist pattern (not illustrated) is formed. Using this photoresist pattern as an etching mask, the insulating film 7 is patterned (pattern formation, processing and selective removal) by dry etching, as illustrated in FIG. 6. The photoresist pattern is removed by ashing or the like.

Figure 7:
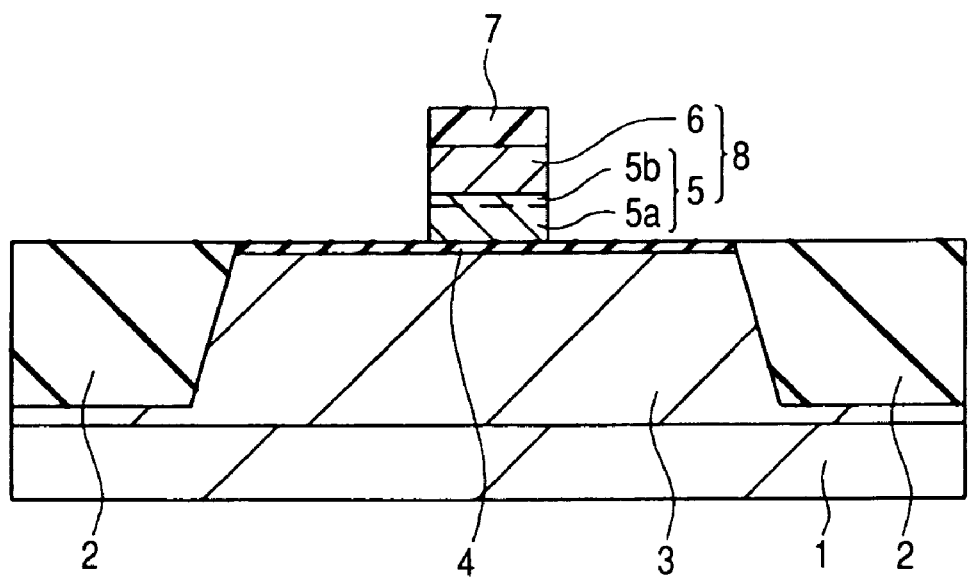
FIG. 7 is a fragmentary cross-sectional view of the semiconductor device during a manufacturing step following that of FIG. 6.
Figure 8:
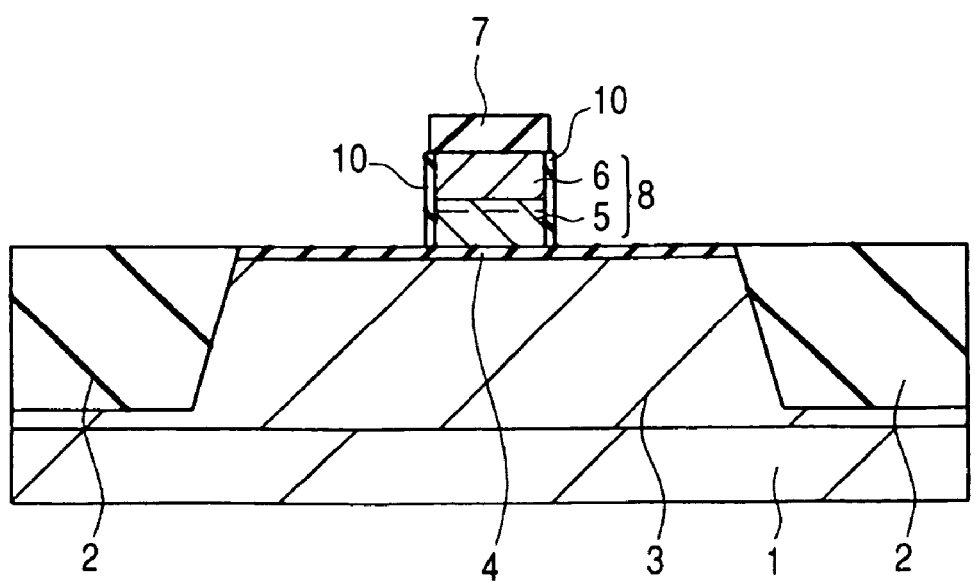
FIG. 8 is a fragmentary cross-sectional view of the semiconductor device during a manufacturing step following that of FIG. 7.

As illustrated in FIG. 7, using the patterned insulating film 7 as an etching mask, the tungsten silicide film 6 and the polycrystalline silicon film 5 are patterned (pattern formation, processing, selective removal) by dry etching, whereby a gate electrode 8 (so-called polycide gate) having the polycrystalline silicon film 5 and tungsten suicide film 6 stacked one after another is formed. Alternatively, a photoresist pattern is formed over the tungsten suicide film 6 while omitting the formation of the insulating film 7, and, using the photoresist pattern as an etching mask, the tungsten suicide film 6 and polycrystalline silicon film 5 are patterned by dry etching.

The semiconductor substrate 1 is then subjected to heat treatment (light oxidation). This heat treatment is performed in an oxygen-containing atmosphere (for example, oxygen (O$_2$) gas atmosphere). By this heat treatment (light oxidation), a thin silicon oxide film (oxide film) 10 is formed over an exposed portion (meaning sidewalls here) of the gate electrode 8, that is, an exposed portion (meaning sidewalls here) of the patterned tungsten silicide film 6 and polycrystalline silicon film 5.

The silicon oxide film 10 formed over the exposed portion (sidewalls) of the gate electrode 8 by heat treatment (light oxidation) after formation of the gate electrode 8 can function as a protecting film capable of protecting abnormal oxidation of the exposed portion of the gate electrode 8 in the various subsequent heat treatment steps, for example, the heat treatment (annealing) step after ion implantation upon formation of impurity diffusion layers (for example, n$^-$ type semiconductor region 11, or n$^+$ type semiconductor regions 13). The silicon oxide film 10 can function also as a protecting film upon ion implantation. Moreover, the silicon oxide film 10 can function to improve adhesion between the gate electrode 8 and an insulating film (for example, an insulating film or interlevel insulating film for the formation of sidewall spacers 12) to be formed to cover the gate electrode 8 in a later step.

By the heat treatment (light oxidation) after formation (patterning) of the gate electrode 8, the damage of the gate insulating film 4 caused by dry etching upon patterning of the tungsten silicide film 6 and polycrystalline silicon film 5 is repaired. Although each interface has an acute angle when the patterning (dry etching) of the tungsten silicide film 6 and polycrystalline silicon film 5 is completed, it is rounded by this heat treatment (light oxidation), making it possible to relax the electric field concentration in edge portions (regions in the vicinity of the sidewalls of the gate electrode 8) of the interface between the gate insulating film 4 and polycrystalline silicon film 5.

By the heat treatment (light oxidation) after the formation (patterning) of the gate electrode 8, the tungsten silicide film 6 is recrystallized to reduce its resistivity. In this Embodiment, the resistivity of the tungsten silicide film 6 which is 1000 μΩcm or greater upon film formation, lowers to 400 μΩcm or less, preferably to 200 to 300 μΩcm. This leads to a reduction in the resistance of the gate electrode 8 and, in turn, an improvement in the electrical properties of the semiconductor device.

Figure 9:
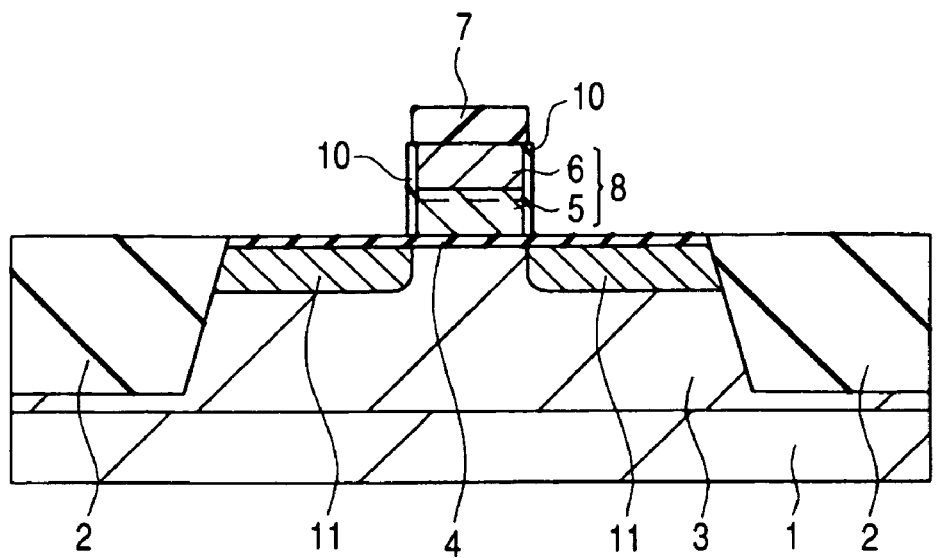
FIG. 9 is a fragmentary cross-sectional view of the semiconductor device during a manufacturing step following that of FIG. 8.

As illustrated in FIG. 9, n$^-$ type semiconductor regions 11 are formed by ion implantation of an impurity such as phosphorus (P) in the region of the p well 3 on both sides of the gate electrode 8 (and subsequent heat treatment).

Figure 10:
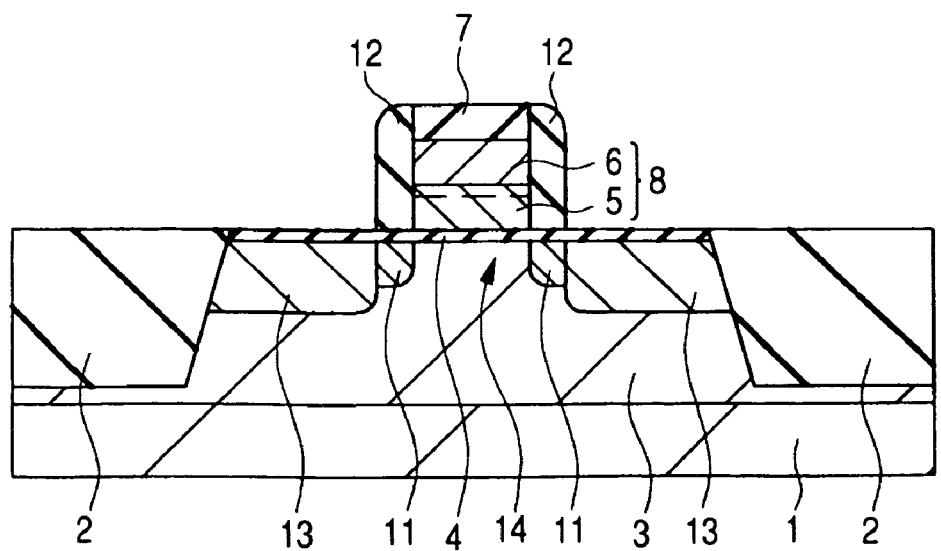
FIG. 10 is a fragmentary cross-sectional view of the semiconductor device during a manufacturing step following that of FIG. 9.

As illustrated in FIG. 10, sidewalls or sidewall spacers 12 made of, for example, silicon oxide are formed over the sidewalls of the gate electrode 8. These sidewall spacers 12 can be formed, for example, by depositing a silicon oxide film over the semiconductor substrate 1 and then conducting anisotropic etching of this silicon oxide film. In the drawings on and after FIG. 10, to facilitate understanding of the subject matter, the silicon oxide film 10 is included in the sidewall spacers 12 and illustration of the silicon oxide film 10 is omitted.

After formation of the sidewall spacers 12, n$^+$ type semiconductor regions 13 (source, drain) are formed, for example, by ion implantation of an impurity such as phosphorus (P) in the region of the p well 3 on both sides of the gate electrode 8 and sidewall spacers 12 (and subsequent heat treatment). The impurity concentration in the n$^+$ type semiconductor regions 13 is higher than that of the n$^-$ type semiconductor regions 11.

In the above-described manner, an n channel MISFET (Metal Insulator Semiconductor Field Effect Transistor) 14 is formed over the p well 3.

Figure 11:
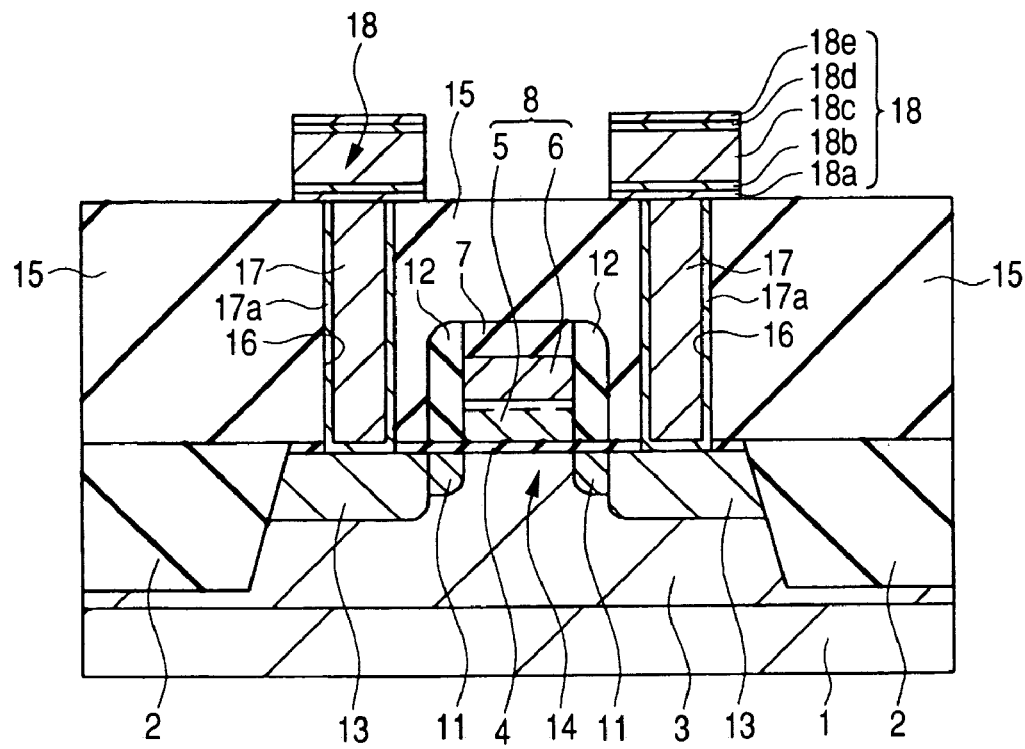
FIG. 11 is a fragmentary cross-sectional view of the semiconductor device during a manufacturing step following that of FIG. 10.

As illustrated in FIG. 11, an insulating film 15 made of a silicon oxide film, or a film stack consisting of a silicon nitride film and a silicon oxide film is formed over the semiconductor substrate 1. The insulating film 15 is dry etched by photolithography to form a contact hole (through hole) 16 over the n$^+$ type semiconductor regions (source, drain) 13. From the bottom of the contact hole 16, a portion of the main surface of the semiconductor substrate 1, for example, a portion of the n$^+$ type semiconductor regions 13 or portion of the gate electrode 8 is exposed.

In the contact hole 16, a plug 17 made of tungsten (W) is then formed. The plug 17 can be formed by forming a titanium nitride film 17a as a barrier film over the insulating film 15 including the inside of the contact hole 16, forming a tungsten film by CVD (Chemical Vapor Deposition) over the titanium nitride film 17a so as to embed the contact hole with the tungsten film, and removing unnecessary portions of the tungsten film and titanium nitride film 17a over the insulating film 15 by CMP (chemical mechanical polishing) or etch back.

Over the insulating film 15 having the plug 17 embedded therein, an interconnect (first wiring layer) 18 is then formed. The interconnect 18 is formed, for example, by successively forming, over the insulating film 15 having the plug 17 embedded therein, a refractory metal film 18a such as a titanium film, a refractory metal nitride film 18b, such as a titanium nitride film, a relatively thick conductor film (aluminum film) 18c composed only of aluminum (Al) or composed mainly of aluminum such as an aluminum alloy, a refractory metal film 18d such as a titanium film and a refractory metal nitride film 18e such as a titanium nitride film and processing them into a predetermined pattern by photolithography. The interconnect 18 is electrically connected to the $n^+$ type semiconductor region 13 or gate electrode 8 via the plug 17. Not only the aluminum interconnect as described above, but also a variety of interconnects can be adopted as the interconnect 18. For example, an aluminum interconnect composed singly of aluminum (Al) or aluminum alloy, a tungsten interconnect or a copper interconnect (copper buried interconnect formed by the damascene method) can be employed. Formation of an interlevel insulating film or upper interconnect layers will follow, but a description thereof is omitted here.

Figure 12:
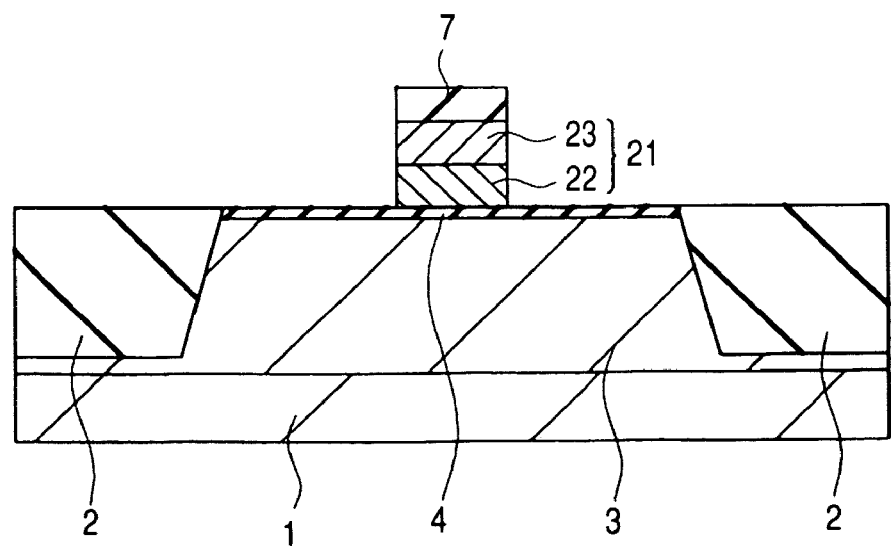
FIG. 12 is a fragmentary cross-sectional view of a gate electrode of a Comparative Example after formation.

FIG. 12 is a fragmentary cross-sectional view illustrating a gate electrode 21 of a Comparative Example after formation (patterning).

The gate electrode 21 of the Comparative Example as illustrated in FIG. 12 has a stack structure, over a gate insulating film 4, composed of a polycrystalline silicon film 22 having an impurity (phosphorus (P)) doped therein and a tungsten silicide film 23.

Figure 13:
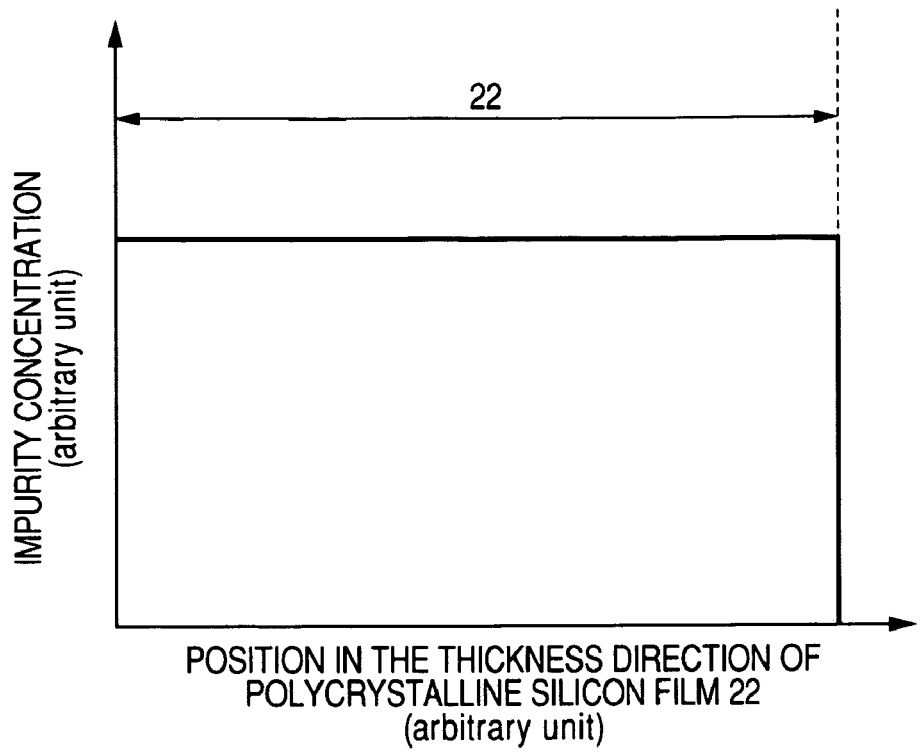
FIG. 13 is a graph showing the impurity concentration distribution of the polycrystalline silicon film of the gate electrode in the Comparative Example in the film thickness direction.

FIG. 13 is a graph illustrating an impurity concentration distribution of the polycrystalline silicon film 22 of the gate electrode 21 of the Comparative Example in its thickness direction (a direction vertical to the main surface of the semiconductor substrate 1) upon deposition, and it corresponds to FIG. 3 of this Embodiment. In the graph of FIG. 13, the abscissa corresponds to the position (arbitrary unit) of the polycrystalline silicon film 22 in its thickness (film thickness) direction from the lower surface of the polycrystalline silicon film 22 in contact with the gate insulating film 4 to the upper surface of the polycrystalline silicon film 22, while the ordinate of FIG. 13 corresponds to the impurity concentration (arbitrary unit), meaning the concentration of phosphorus in this graph, in the polycrystalline silicon film 22.

As can be seen from FIG. 13, the impurity concentration distribution of the polycrystalline silicon film 22 of the gate electrode 21 in the Comparative Example in its thickness direction is almost uniform, which is different from that of the polycrystalline silicon film 5 according to this Embodiment.

Figure 14:
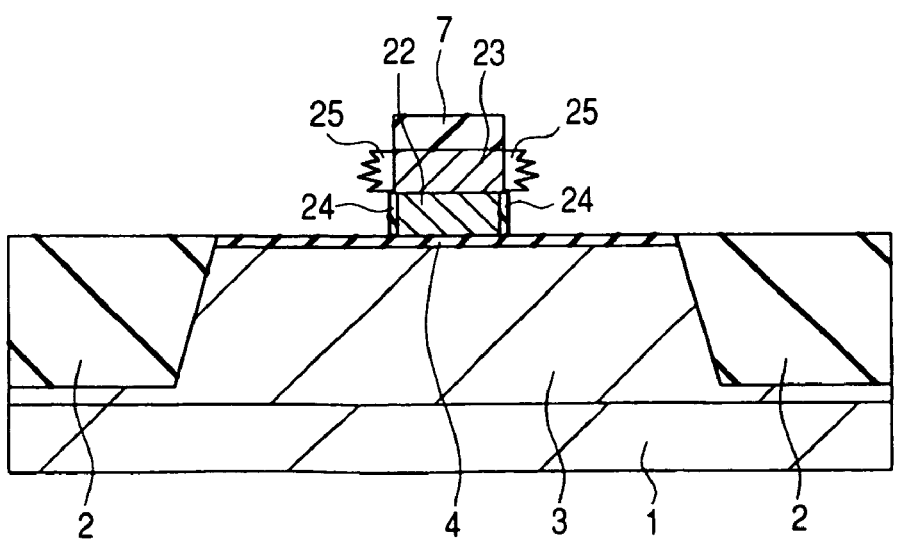
FIG. 14 is a fragmentary cross-sectional view illustrating the gate electrode in the Comparative Example after heat treatment in an oxygen-containing atmosphere.

FIG. 14 is a fragmentary cross-sectional view of the substrate subjected to heat treatment (light oxidation treatment) in an oxygen-containing atmosphere after the formation (patterning) of the gate electrode 21 of the Comparative Example as illustrated in FIG. 12. It corresponds to FIG. 8 of this Embodiment.

When heat treatment (light oxidation treatment) is conducted in an oxygen-containing atmosphere after the formation (patterning) of the gate electrode 21 of the Comparative Example having a constitution as described above, silicon (Si) in the polycrystalline silicon film 22 diffuses into the tungsten silicide film 23. This causes a rise in the concentration of phosphorus (P) in the polycrystalline silicon film 22 in a region in the vicinity of the interface between the polycrystalline silicon film 22 and the tungsten silicide film 23, leading to a disturbance (inhibition) of the silicon (Si) from being fed from the polycrystalline silicon film 22 to the tungsten silicide film 23. The silicon (Si) concentration in the tungsten silicide film 23 therefore lowers and the amount of silicon (Si) fed to the exposed surface (sidewalls) of the tungsten silicide film 23 from the inside of the tungsten silicide film 23 decreases (lacks in silicon). When the silicon (Si) is not fed adequately to the exposed surface (sidewalls) of the tungsten silicide film 23 and a region in the vicinity of the exposed surface (sidewalls) of the tungsten silicide film 23 becomes rich in W, formation of a silicon oxide ($SiO_2$) film does not occur, but oxidation of tungsten (oxidation of W, abnormal oxidation) occurs (is promoted) on the exposed surface (sidewalls) of the tungsten silicide film 23. This results in the appearance of different films on the sidewalls of the gate electrode 21. More specifically, a silicon oxide film 24 is formed on the exposed surface (sidewalls) of the polycrystalline silicon film 22, while tungsten oxide 25, which has been formed by the oxidation (abnormal oxidation) of tungsten, is formed on the exposed surface (sidewalls) of the tungsten silicide film 23.

There is a potential danger of destruction of the gate insulating film 4 owing to the oxidation (abnormal oxidation) of tungsten (W) on the sidewalls of the gate electrode 21. The tungsten oxide 25 tends to exhibit an abnormal growth in the whisker form (needle form) and presumably causes a short-circuit between the two adjacent gate electrodes. It may also become a cause for creation of a pollutant during the manufacturing steps of the semiconductor device. These phenomena deteriorate the reliability of the semiconductor device and reduce the production yield of the semiconductor device.

In this Embodiment, on the other hand, the impurity concentration of the polycrystalline silicon area 5b corresponding to the upper layer portion (region in the vicinity of the upper surface) of the polycrystalline silicon film 5 constituting the gate electrode 8 is smaller than that of the polycrystalline silicon area 5a corresponding to the lower layer (region in the vicinity of the lower surface) and inside region (a region inner than the polycrystalline silicon area 5b) of the polycrystalline silicon film 5. More preferably, the polycrystalline silicon area 5a is formed of polycrystalline silicon having an impurity implanted (doped) therein, while the polycrystalline silicon area 5b is formed of polycrystalline silicon having no impurity implanted therein, that is, non-doped polycrystalline silicon. The impurity concentration (here, phosphorus (P) concentration) of the polycrystalline silicon area 5b, which is a region of the polycrystalline silicon film 5 in the vicinity of the interface with the tungsten silicide film 6, is lowered. In other words, the impurity concentration of the polycrystalline silicon film 5 in a region near the tungsten silicide film 6 is adjusted to be lower than that of the impurity concentration in a region near the gate insulating film 4 so that even if silicon (Si) diffuses from the polycrystalline silicon film 5 to the tungsten silicide film 6 upon heat treatment (light oxidation treatment) in an oxygen-containing atmosphere after formation (patterning) of the gate electrode 8, an increase in the concentration of phosphorus (P) in a region (that is, the polycrystalline silicon area 5b) in the vicinity of the interface between the polycrystalline silicon film 5 and the tungsten silicide film 6 does not occur and feeding of silicon (Si) from the polycrystalline silicon film 5 to the tungsten silicide film 6 is not disturbed (inhibited). Silicon (Si) is therefore fed from the inside of the tungsten silicide film 6 to the surface (sidewalls) of the tungsten silicide film 6, and the silicon oxide ($SiO_2$) film 10 is formed on the surface (sidewalls) of the tungsten silicide film 6, whereby oxidation (abnormal oxidation) of tungsten (W) on the exposed surface (sidewalls) of the gate electrode 8 is suppressed.

In this Embodiment, as described above, the tungsten silicide film 6 is formed so that the resistivity thereof upon film formation (upon deposition) exceeds 1000 μΩcm and thereby, the Si ratio (y/x in $W_xSi_y$) of the tungsten silicide film 6 is adjusted to be relatively large, more specifically, the tungsten silicide film is formed to satisfy the following composition ratio: y/x≧2 in $W_xSi_y$. This enables a sufficient supply of silicon (Si) to the surface (sidewalls) of the tungsten silicide film 6 from the inside of the tungsten silicide film 6 and promotes the formation of the silicon oxide ($SiO_2$) film 10 on the surface (sidewalls) of the tungsten suicide film 6. An investigation by the present inventors has revealed that when the resistivity of the tungsten silicide film 6 upon formation (deposition) is adjusted at 1000 μΩcm or greater, the formation of the silicon oxide ($SiO_2$) film 10 on the exposed surface (sidewalls) of the gate electrode 8 is promoted, which brings about considerably high inhibitory effects against oxidation (abnormal oxidation) of tungsten (W) on the exposed surface (sidewalls) of the gate electrode 8. In addition, owing to a lowering in the composition ratio of tungsten in the tungsten silicide film 6, oxidation of tungsten can be inhibited and, in turn, abnormal oxidation of the tungsten silicide film 6 can be prevented.

As described above, oxidation (abnormal oxidation) of tungsten on the exposed surface (sidewalls) of the gate electrode 8 can be suppressed or prevented in this Embodiment. This suppresses or prevents the destruction of the gate insulating film 4, and in addition, improves the reliability of the semiconductor device (reduces degradation failures) and improves the production yield. Owing to the improvement in the reliability, the time spent for a reliability evaluation test can be shortened.

In this Embodiment, oxidation (abnormal oxidation) of tungsten on the sidewalls of the gate electrode 8 is suppressed by adjusting the resistivity of the tungsten suicide film 6 upon formation (deposition) to 1000 μΩcm or greater and thereby, causing a relative increase in the Si ratio of the tungsten silicide film 6. When the resistivity of the tungsten silicide film 6 is not changed from 1000 μΩcm or greater, however, there is a potential danger of an increase in the resistance of the gate electrode 8 and a deterioration in the performance of the semiconductor device. In this Embodiment, when the heat treatment (light oxidation treatment) is conducted after the formation (patterning) of the gate electrode 8, the tungsten silicide film 6 is recrystallized and its resistivity lowers. In this Embodiment, this heat treatment (light oxidation) lowers the resistivity of the tungsten silicide film 6 to 400 μΩcm or less, more preferably to 200 to 300 μΩcm. This heat treatment thus enables a reduction in the resistance of the gate electrode 8 and an improvement of the electrical properties of the semiconductor device.

In this Embodiment, the thickness (thickness in a direction vertical to the main surface of the semiconductor substrate 1, deposition thickness) of the polycrystalline silicon film 5b having a relatively low impurity concentration preferably falls within a range of from 1% to 6% of the entire thickness (thickness in a direction vertical to the main surface of the semiconductor substrate 1, deposition thickness) of the polycrystalline silicon film 5. This makes it possible to suppress the resistance of the gate electrode 8 and thereby improve the performance of the semiconductor device and at the same time, to suppress oxidation (abnormal oxidation) of tungsten on the sidewalls of the gate electrode 8, resulting in a further improvement in the electrical properties and the reliability of the semiconductor device.

Embodiment 2

Figure 15:
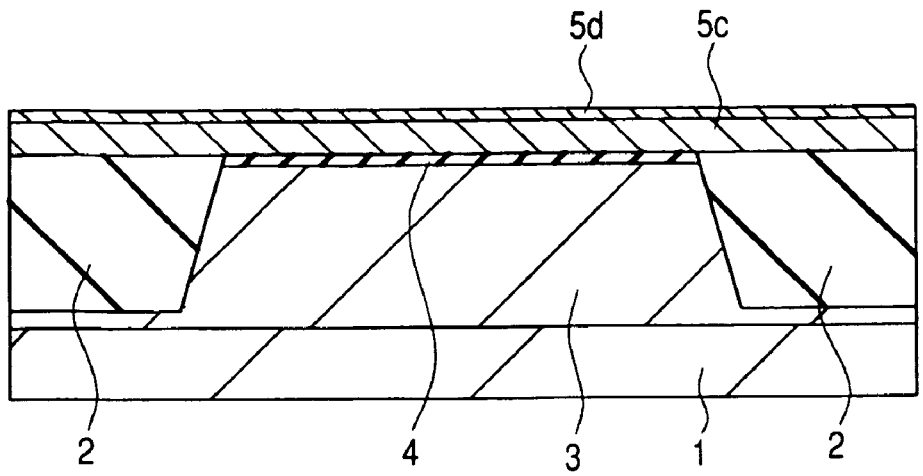
FIG. 15 is a fragmentary cross-sectional view of a semiconductor device according to another embodiment of the present invention during a manufacturing step thereof.

FIG. 15 is a fragmentary cross-sectional view of a semiconductor device according to another embodiment of the present invention during its manufacturing step. In this Embodiment, the manufacturing steps as illustrated in FIG. 1 in Embodiment 1 can be similarly employed, and so a description thereof is omitted, and steps subsequent to those as illustrated in FIG. 1 will be described next.

After the formation of the structure as illustrated in FIG. 1, a polycrystalline silicon film 5c is formed over the semiconductor substrate 1, more specifically, the gate insulating film 4 as illustrated in FIG. 15. The polycrystalline silicon film 5c is composed of polycrystalline silicon (doped polycrystalline silicon) doped with an impurity (for example, phosphorus (P)). The polycrystalline silicon film 5c can be formed, for example, by CVD and it can be formed by introducing monosilane ($SiH_4$) and phosphine ($PH_3$) gases into a film forming chamber of a film forming apparatus. A polycrystalline silicon film 5d is then formed over the polycrystalline silicon film 5c. The polycrystalline silicon film 5d has an impurity concentration lower than that of the polycrystalline silicon film 5c and is preferably composed of a polycrystalline silicon film having no impurity introduced therein (which means undoped or nondoped polycrystalline silicon film). The polycrystalline silicon film 5d can be formed, for example, by CVD and can be formed for example by introducing a monosilane ($SiH_4$) gas into a film forming chamber of a film forming apparatus.

Figure 16:
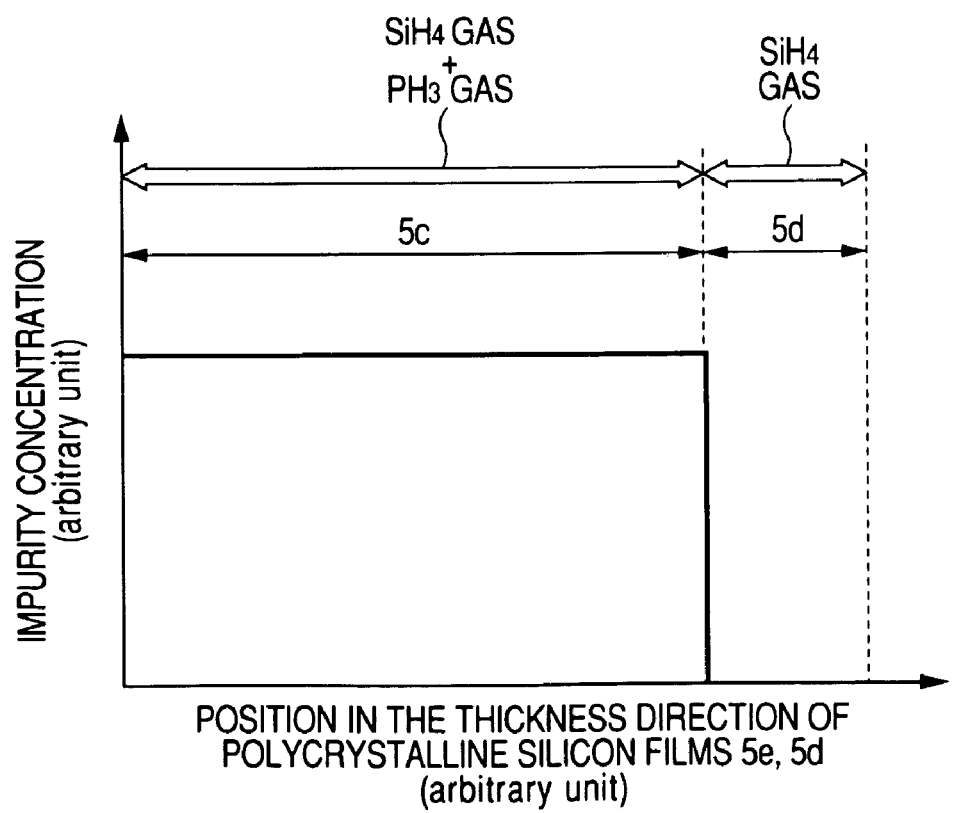
FIG. 16 is a graph illustrating the impurity concentration distribution of a polycrystalline silicon film in its thickness direction.

FIG. 16 is a graph illustrating the impurity concentration distribution of the polycrystalline silicon films 5c and 5d in their thickness direction (a direction vertical to the main surface of the semiconductor substrate 1) after formation (deposition). This graph corresponds to FIG. 3 of Embodiment 1. In FIG. 16, the abscissa corresponds to the position (arbitrary unit) of the polycrystalline silicon films 5c and 5d in their thickness (film thickness) direction from the lower surface of the polycrystalline silicon film 5c in contact with the gate insulating film 4 to the upper surface of the polycrystalline silicon film 5d, while the ordinate corresponds to the impurity concentration (arbitrary unit), meaning the concentration of phosphorus (P) in this graph, of the polycrystalline silicon films 5c and 5d. In the graph of FIG. 16, the kind of gases introduced into the film forming apparatus upon formation of the polycrystalline silicon films 5c and 5d is also described.

The polycrystalline silicon film 5c in this Embodiment corresponds to the polycrystalline silicon area 5a of the polycrystalline silicon film 5 in Embodiment 1, while the polycrystalline silicon film 5d corresponds to the polycrystalline silicon area 5b in Embodiment 1. The thickness of each of the polycrystalline silicon film 5c and polycrystalline silicon film 5d corresponds to the thickness of each of the polycrystalline silicon area 5a and polycrystalline silicon area 5b. The polycrystalline silicon area 5a and polycrystalline silicon area 5b of the polycrystalline silicon film 5 are formed continuously in Embodiment 1, while the polycrystalline silicon film 5d is formed after the formation of the polycrystalline silicon film 5c in this Embodiment.

As illustrated in FIG. 16, the impurity concentration of the polycrystalline silicon film 5d on the upper side is smaller than that of the polycrystalline silicon film 5c on the lower side in this Embodiment. It is more preferable to constitute the lower polycrystalline silicon film 5c from polycrystalline silicon having an impurity doped therein (doped polycrystalline silicon) and constitute the upper polycrystalline silicon film 5d from polycrystalline silicon having no impurity doped therein (nondoped polycrystalline silicon).

Figure 17:
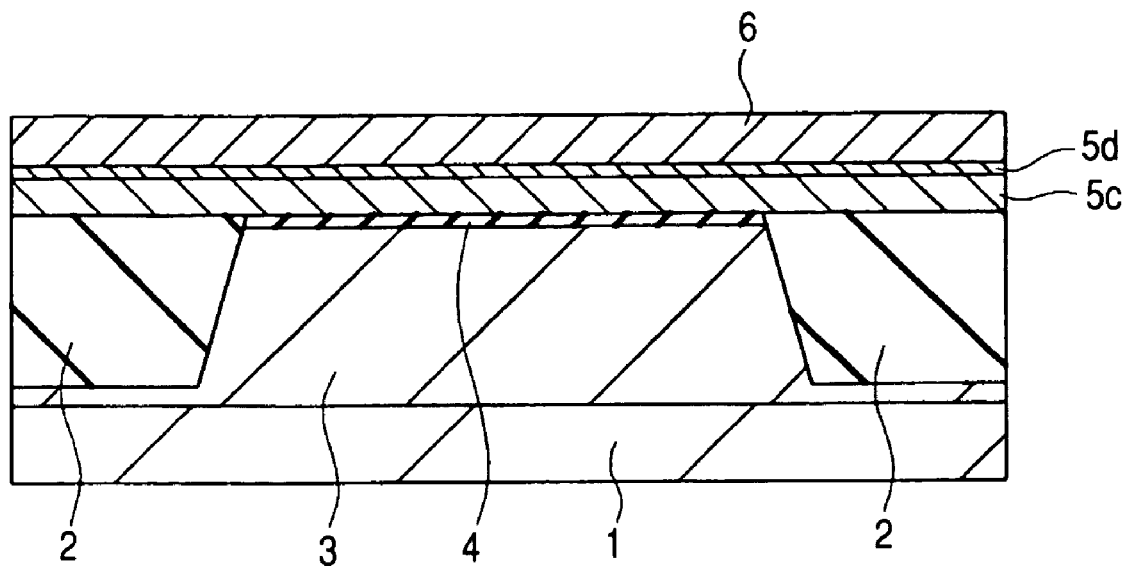
FIG. 17 is a fragmentary cross-sectional view of the semiconductor device during a manufacturing step following that of FIG. 15.
Figure 18:
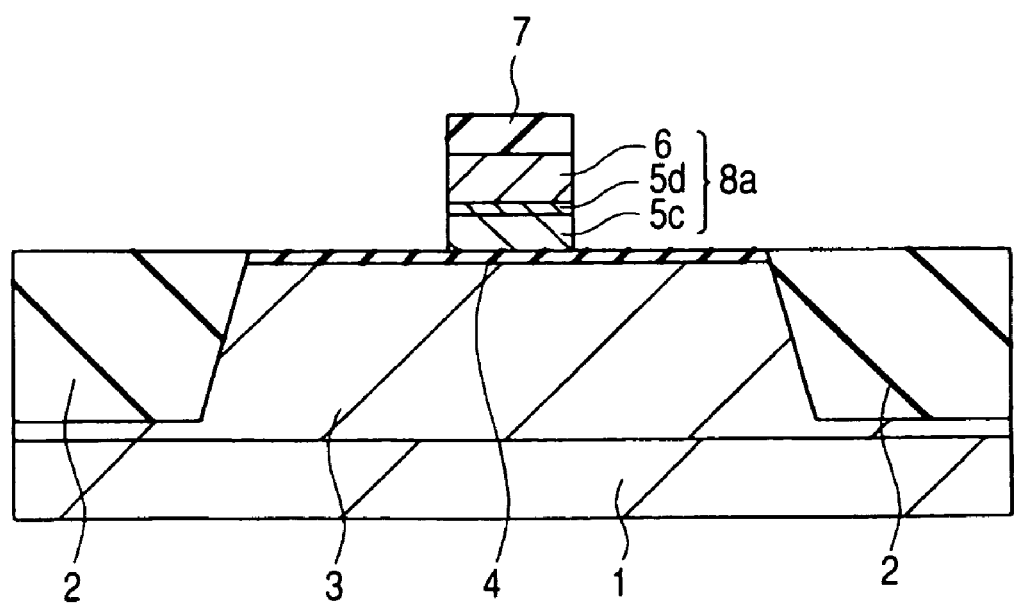
FIG. 18 is a fragmentary cross-sectional view of the semiconductor device during a manufacturing step following that of FIG. 17.
Figure 19:
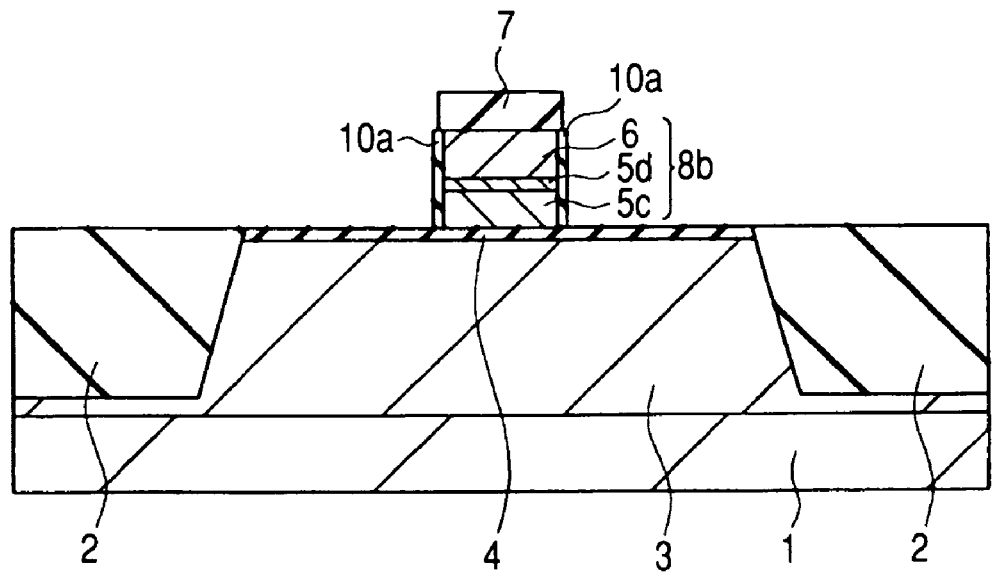
FIG. 19 is a fragmentary cross-sectional view of the semiconductor device during a manufacturing step following that of FIG. 18.

The manufacturing steps after that are similar to those of Embodiment 1. FIGS. 17 to 19 are fragmentary cross-sectional views of the semiconductor device showing the manufacturing steps following that of FIG. 15.

As illustrated in FIG. 17, a tungsten silicide ($W_xSi_y$) film 6 is formed over the semiconductor substrate 1 (over the polycrystalline silicon film 5d). At this time, the resistivity of the tungsten silicide film 6 upon formation (as-deposition) is adjusted to exceed 1000 μΩcm as in Embodiment 1. An insulating film 7 is then formed over the semiconductor substrate 1 (over the tungsten silicide film 6). The insulating film 7 is patterned by photolithography and dry etching. Using the patterned insulating film 7 as an etching mask, the tungsten silicide film 6, polycrystalline silicon film 5d and polycrystalline silicon film 5c are patterned by dry etching, whereby a gate electrode (so-called polycide gate) 8a having the polycrystalline silicon film 5c, polycrystalline silicon film 5d and tungsten silicide film 6 stacked one after another is formed as illustrated in FIG. 18.

The semiconductor substrate 1 is then subjected to heat treatment (light oxidation treatment) as in Embodiment 1. This heat treatment is performed in an oxygen-containing atmosphere (for example, in an oxygen ($O_2$) gas atmosphere). Due to this heat treatment (light oxidation), a thin silicon oxide film 10a is formed over the sidewalls of the gate electrode 8a, that is, the sidewalls of the patterned tungsten silicide film 6 and polycrystalline silicon films 5c and 5d as illustrated in FIG. 19 and the gate insulating film 4 damaged by dry etching upon patterning (processing) of the tungsten silicide film 6 and polycrystalline silicon films 5c and 5d is repaired. By the heat treatment (light oxidation) after the formation of the gate electrode 8a, recrystallization of the tungsten silicide film 6 occurs, leading to a reduction in its resistivity. The resistivity of the tungsten silicide film 6 is reduced to 400 μΩcm or less, more preferably 200 to 300 μΩcm. Manufacturing steps subsequent to this heat treatment are similar to those of Embodiment 1 (FIGS. 9 to 11), and so the description thereof is omitted.

Also in this Embodiment, advantages similar to those of Embodiment 1 are available. More specifically, in this Embodiment, the impurity concentration of the upper polycrystalline silicon film 5d is smaller than that of the lower polycrystalline silicon film 5c. More preferably, the polycrystalline silicon film 5c is formed of impurity-doped polycrystalline silicon, while the polycrystalline silicon film 5d is formed of impurity-nondoped polycrystalline silicon. Since the impurity concentration (here, the concentration of phosphorus (P)) of the polycrystalline silicon film 5d between the polycrystalline silicon film 5c and tungsten silicide film 6 is adjusted to a low, even diffusion of silicon (Si) in the polycrystalline silicon films 5c and 5d to the tungsten silicide film 6 upon heat treatment (light oxidation treatment) in an oxygen-containing atmosphere after the formation (patterning) of the gate electrode 8a, the concentration of phosphorus (P) in the polycrystalline silicon film 5d does not increase, and silicon (Si) is fed from the polycrystalline silicon films 5c and 5d to the tungsten silicide film 6 without being disturbed (inhibited). Silicon (Si) is therefore fed to the surface (sidewalls) of the tungsten silicide film 6 from the inside of the tungsten silicide film 6. In addition, since the Si ratio (that is, x/y of $W_xSi_y$) of the tungsten silicide film 6 is made relatively large by adjusting the resistivity of the tungsten silicide film 6 upon formation (as-deposition) to 1000 μΩcm or greater, silicon (Si) is fed sufficiently to the surface (sidewalls) of the tungsten silicide film 6 from the inside of the tungsten silicide film 6. Owing to this silicon supply, a silicon oxide ($SiO_2$) film 10 is formed on the surface (sidewalls) of the tungsten silicide film 6 and thereby oxidation (W oxidation, abnormal oxidation) of tungsten on the exposed surface (sidewalls) of the gate electrode 8a can be suppressed or prevented.

In this Embodiment, oxidation (abnormal oxidation) of tungsten on the exposed surface (sidewalls) of the gate electrode 8a can be suppressed or prevented as in Embodiment 1 so that destruction of the gate insulating film 4 can be suppressed or prevented. In addition, the reliability of the semiconductor device can be improved (degradation failures are reduced) and the production yield can be improved. This reliability improvement results in a reduction of the time necessary for a reliability evaluation test.

In this Embodiment similar to Embodiment 1, by the heat treatment (light oxidation) after the formation of the gate electrode 8a, recrystallization of the tungsten silicide film 6 occurs, leading to a reduction in its resistivity. The resistivity of the tungsten silicide film 6 is reduced to 400 μΩcm or less, more preferably 200 to 300 μΩcm. This makes it possible to reduce the resistance of the gate electrode 8a and improve the electrical properties of the semiconductor device.

In this Embodiment, it is preferred that the thickness (thickness in a direction vertical to the main surface of the semiconductor substrate 1, deposition thickness) of the polycrystalline silicon film 5d having a relatively low impurity concentration falls within a range of from 1% to 6% of the total thickness (thickness in the direction vertical to the main surface of the semiconductor substrate 1, deposition thickness) of the polycrystalline silicon films 5c and 5d. Within this range, the resistance of the gate electrode 8a can be suppressed and the performance of the semiconductor device can be improved. At the same time, oxidation (abnormal oxidation) of tungsten on the sidewalls of the gate electrode 8a can be suppressed sufficiently. This leads to a further improvement in the electrical properties and reliability of the semiconductor device.

Embodiment 3

Figure 20:
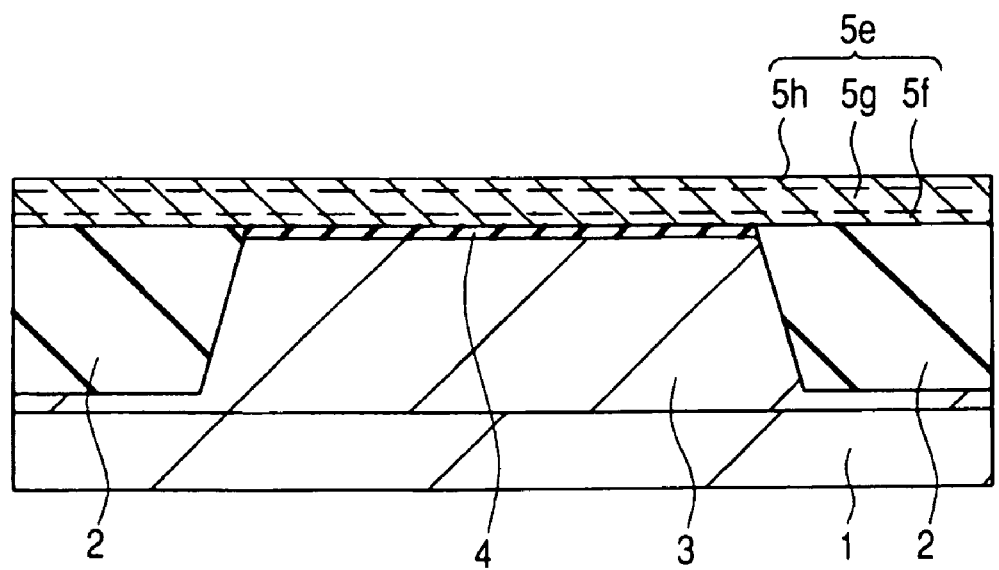
FIG. 20 is a fragmentary cross-sectional view of a semiconductor device according to a further embodiment of the present invention during a manufacturing step thereof.

FIG. 20 is a fragmentary cross-sectional view of a semiconductor device according to a further embodiment of the present invention during its manufacturing step. In this Embodiment, the manufacturing steps as illustrated in FIG. 1 in Embodiment 1 can be similarly employed, and so a description thereof is omitted, and steps subsequent to those as illustrated in FIG. 1 will be described next.

After the formation of the structure as illustrated in FIG. 1, a polycrystalline silicon film 5e is formed over the semiconductor substrate 1, more specifically, the gate insulating film 4. The polycrystalline silicon film 5e can be formed, for example, by CVD.

Figure 21:
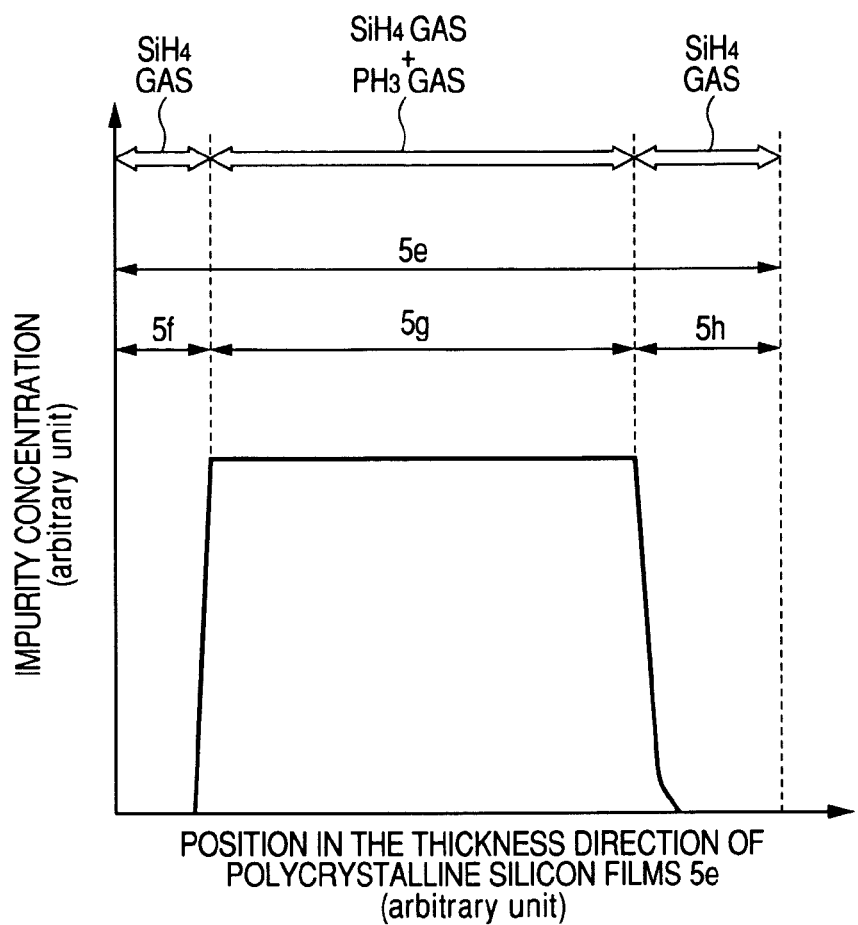
FIG. 21 is a graph illustrating the impurity concentration distribution of the polycrystalline silicon film in its thickness direction.

FIG. 21 is a graph showing an impurity concentration distribution of the polycrystalline silicon film 5e in its thickness direction (a direction vertical to the main surface of the semiconductor substrate 1) after formation (deposition) and it corresponds to FIG. 3 of Embodiment 1. In FIG. 21, the abscissa corresponds to the position (arbitrary unit) of the polycrystalline silicon film 5e in its thickness (film thickness) direction from the lower surface of the polycrystalline silicon film 5e in contact with the gate insulating film 4 to the upper surface of the polycrystalline silicon film 5e, while the ordinate in the graph of FIG. 21 corresponds to the impurity concentration (arbitrary unit), meaning the concentration of phosphorus (P) in this graph, of the polycrystalline silicon film 5e. In the graph of FIG. 21, the kind of gases introduced into the film forming apparatus upon formation of the polycrystalline silicon film 5e is also specified.

As can be seen from FIG. 21, in the initial stage of the formation of the polycrystalline silicon film 5e, a monosilane ($SiH_4$) gas is introduced into a film forming apparatus (for example, CVD apparatus) and the formation of the polycrystalline silicon film 5e is carried out while preventing the introduction (doping) of an impurity into the polycrystalline silicon film 5e. After the polycrystalline silicon film 5e (that is, polycrystalline silicon area 5f) acquires a predetermined thickness, introduction of a phosphine ($PH_3$) gas into the film forming apparatus is started (meaning that monosilane ($SiH_4$) and phosphine ($PH_3$) gases are introduced), whereby the polycrystalline silicon film 5e is formed so as to introduce (dope) an impurity (for example, phosphorus (P)) therein. After the polycrystalline silicon film 5e (that is, polycrystalline silicon area 5g) acquires a predetermined thickness, introduction of the phosphine ($PH_3$) gas into the film forming apparatus is terminated. By introducing only the monosilane ($SiH_4$) gas as a film forming gas, the polycrystalline silicon film 5e (that is, polycrystalline silicon area 5h) is formed so as to prevent introduction of an impurity therein.

As illustrated in FIG. 21, the polycrystalline silicon film 5e having the polycrystalline silicon area (undoped or non-doped polycrystalline silicon area) 5f which has been formed in the introduction stage of the monosilane ($SiH_4$) gas (without introducing the phosphine ($PH_3$) gas) and has a relatively low impurity concentration; the polycrystalline silicon area (doped polycrystalline silicon area) 5g which has been formed over the polycrystalline silicon area 5f in the introduction stage of both the monosilane ($SiH_4$) and phosphine ($PH_3$) gases and has a relatively high impurity concentration; and the polycrystalline silicon area (undoped or nondoped polycrystalline silicon area) 5h which has been formed over the polycrystalline silicon area 5g after the termination of the introduction of the phosphine ($PH_3$) gas and has a relatively low impurity concentration is formed. The time spent for the formation of the polycrystalline silicon area 5f while introducing the monosilane ($SiH_4$) gas without introducing the phosphine ($PH_3$) gas is, for example, about 1 minute; that for the formation of the polycrystalline silicon area 5g while introducing both the monosilane ($SiH_4$) and phosphine ($PH_3$) gases is, for example, about 10 minutes; and that for the formation of the polycrystalline silicon area 5h while introducing the monosilane ($SiH_4$) gas without introducing the phosphine ($PH_3$) gas is, for example, 1 minute. The thickness of the polycrystalline silicon area 5f (thickness in a direction vertical to the main surface of the semiconductor substrate 1, deposition thickness) is, for example, about several nm; that of the polycrystalline silicon area 5g (thickness in a direction vertical to the main surface of the semiconductor substrate 1, deposition thickness) is, for example, about 50 nm; and that of the polycrystalline silicon area 5h (thickness in a direction vertical to the main surface of the semiconductor substrate 1, deposition thickness) is, for example, several nm. The polycrystalline silicon area 5g in this Embodiment corresponds to the polycrystalline silicon area 5a in Embodiment 1, while the polycrystalline silicon area 5h corresponds to the polycrystalline silicon area 5b in Embodiment 1.

As illustrated in FIG. 21, the impurity concentration of the polycrystalline silicon area 5h, that is, the upper layer portion of the polycrystalline silicon film 5e (that is, a region of the polycrystalline silicon film 5e in the vicinity of the upper surface) is smaller than that of the polycrystalline silicon area 5g, that is, the inside region of the polycrystalline silicon film 5e (that is, a region inner than the polycrystalline silicon area 5h). Even after the introduction of the phosphine ($PH_3$) gas into the film forming apparatus is terminated, the phosphine ($PH_3$) gas remains in the film forming chamber. The phosphine ($PH_3$) gas concentration in the film forming chamber is gradually decreased due to the gas exhaustion so that the impurity concentration of the polycrystalline silicon film which is to be formed does not become zero as soon as the introduction of the phosphine ($PH_3$) gas is terminated. The impurity concentration gradually decreases and in the end, a non-doped polycrystalline silicon film having substantially no impurity introduced therein is formed. In this Embodiment, the impurity concentration of the upper layer portion of the polycrystalline silicon film 5e (corresponding to the polycrystalline silicon area 5h) is made smaller than that of the inside region (corresponding to the polycrystalline silicon area 5g) of the polycrystalline silicon film 5e. It is preferred to form the inside region of the polycrystalline silicon film 5e (corresponding to the polycrystalline silicon area 5g) from impurity-introduced (doped) polycrystalline silicon and to form the upper layer portion of the polycrystalline silicon film 5e (corresponding to the polycrystalline silicon area 5h) from polycrystalline silicon having no impurity introduced therein (non-doped polycrystalline silicon).

In this Embodiment, as illustrated in FIG. 21, the impurity concentration of the polycrystalline silicon area 5f corresponding to the lower portion of the polycrystalline silicon film 5e (that is, a region of the polycrystalline silicon film 5e in the vicinity of the lower surface (interface with the gate insulating film 4)) is made smaller than that of the polycrystalline silicon area 5g corresponding to the inside region of the polycrystalline silicon film 5e. It is preferred to constitute the lower layer portion (corresponding to the polycrystalline silicon area 5f) of the polycrystalline silicon film 5e from polycrystalline silicon having no impurity introduced therein (non-doped silicon). In other words, the polycrystalline silicon area (film) 5f which is nearer to the gate insulating film 4 than the polycrystalline silicon area (film) 5g having a high impurity concentration is constituted from polycrystalline silicon (film) having a lower impurity concentration than that of the polycrystalline region (film) 5g.

Figure 22:
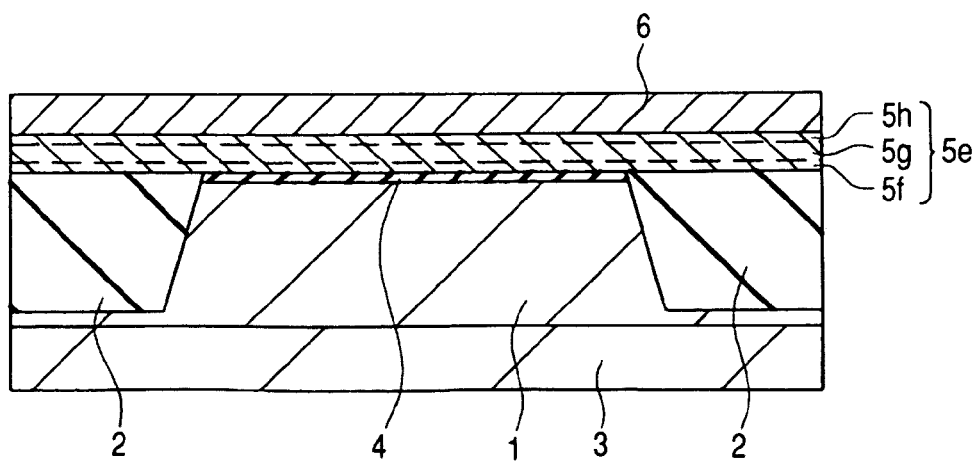
FIG. 22 is a fragmentary cross-sectional view of the semiconductor device during a manufacturing step following that of FIG. 20.
Figure 23:
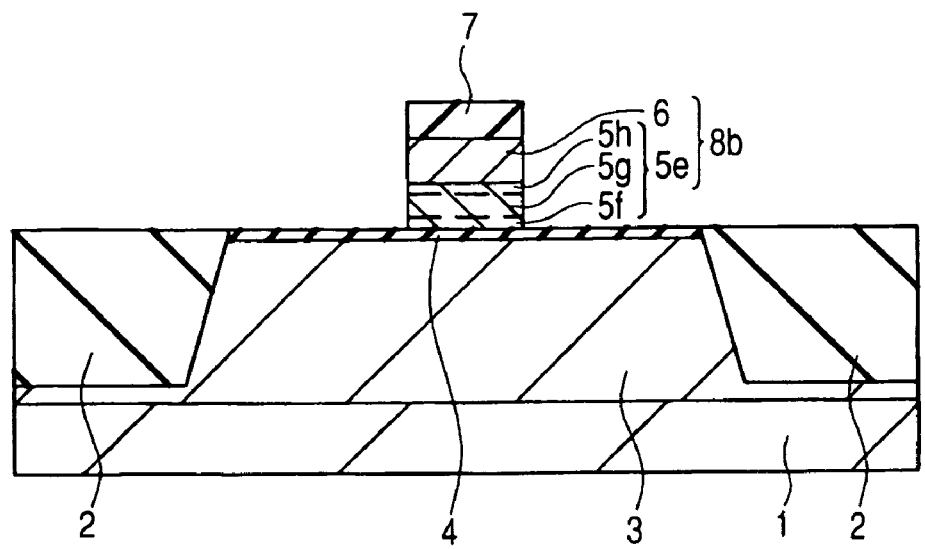
FIG. 23 is a fragmentary cross-sectional view of the semiconductor device during a manufacturing step following that of FIG. 22.
Figure 24:
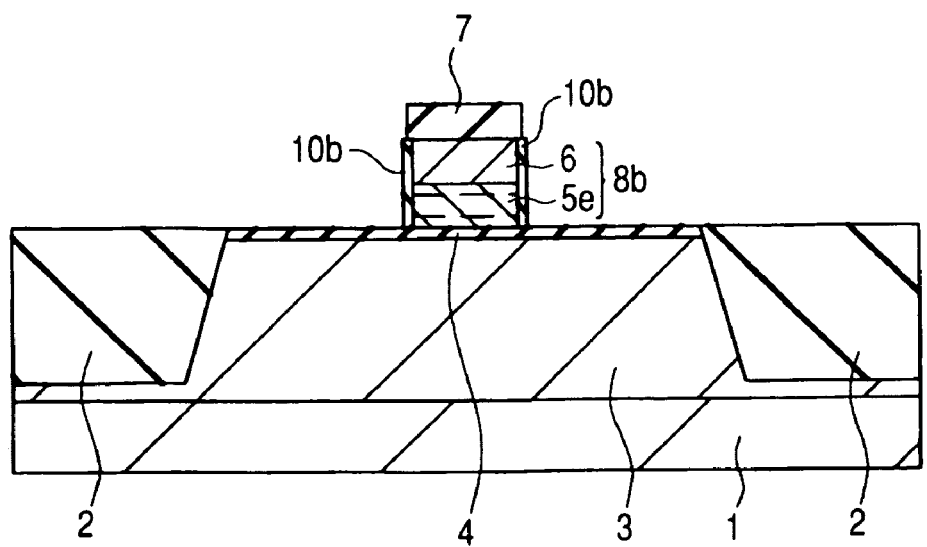
FIG. 24 is a fragmentary cross-sectional view of the semiconductor device during a manufacturing step following that of FIG. 23.

Subsequent manufacturing steps are similar to those of Embodiment 1. FIGS. 22 to 24 are fragmentary cross-sectional views of the semiconductor device during the manufacturing steps following that of FIG. 20.

As illustrated in FIG. 22, the tungsten silicide ($W_xSi_y$) film 6 is formed over the semiconductor substrate 1 (over the polycrystalline silicon film 5e). The resistivity of the tungsten silicide film 6 upon formation (as-deposition) is adjusted to exceed 1000 μΩcm as in Embodiment 1. An insulating film 7 is then formed over the semiconductor substrate 1 (over the tungsten silicide film 6). The insulating film 7 is patterned using photolithography or dry etching. Using the patterned insulating film 7 as an etching mask, the tungsten silicide film 6 and polycrystalline silicon film 5e are patterned by dry etching, whereby a gate electrode (so-called polycide gate) 8b having a stack structure of the polycrystalline silicon film 5e and tungsten silicide film 6 is formed as illustrated in FIG. 23.

As in Embodiment 1, the semiconductor substrate 1 is subjected to heat treatment (light oxidation). This heat treatment is performed in an oxygen-containing atmosphere (for example, in an oxygen ($O_2$) gas atmosphere). By this heat treatment (light oxidation treatment), a thin silicon oxide film 10b is formed over the sidewalls of the gate electrode 8b, that is, the sidewalls of the patterned tungsten silicide film 6 and polycrystalline silicon film 5 and the gate insulating film 4 damaged by dry etching upon patterning (processing) of the tungsten suicide film 6 and polycrystalline silicon film 5 is repaired. By the heat treatment after the formation of the gate electrode 8b, recrystallization of the tungsten silicide film 6 occurs, leading to a reduction in its resistivity. The resistivity of the tungsten silicide film 6 is reduced to 400 μΩcm or less, more preferably 200 to 300 μΩcm. Subsequent manufacturing steps are similar to those of Embodiment 1 (FIGS. 9 to 11), and so a description thereof is omitted.

Similar advantages to those of Embodiment 1 are available in this Embodiment. More specifically, by lowering the impurity concentration (here, concentration of phosphorus (P)) of the polycrystalline silicon area 5h, which is a region of the polycrystalline silicon film 5e in the vicinity of the interface with the tungsten silicide film 6, and at the same time, by adjusting the resistivity of the tungsten silicide film 6 upon formation (as-deposition) to 1000 μΩcm or greater to relatively heighten the Si ratio (that is, y/x of $W_xSi_y$) of the tungsten silicide film 6, it is possible to suppress or prevent oxidation (W oxidation, abnormal oxidation) of tungsten on the sidewalls of the gate electrode, which will otherwise occur upon heat treatment (light oxidation) in an oxygen-containing atmosphere after the formation (patterning) of the gate electrode 8b. This makes it possible to suppress or prevent the destruction of the gate insulating film 4, leading to an improvement in the reliability of the semiconductor device (reduction in degradation failures) and in the production yield. By the improvement in reliability, the time necessary for the reliability evaluation test can be shortened.

Moreover, in this Embodiment, it is possible to suppress or prevent the diffusion of an impurity (for example, phosphorus (P)) from the polycrystalline silicon film 5e to the gate insulating film 4 in the formation step of the polycrystalline silicon film 5e or various heat treatment steps (for example, heat treatment (light oxidation) step after patterning of the gate electrode 8b) by forming the polycrystalline silicon area 5f which is a region of the polycrystalline silicon film 5e in the vicinity of the interface with the gate insulating film 4 from polycrystalline silicon having a low impurity concentration, particularly non-doped polycrystalline silicon in this Embodiment. This makes it possible to improve the reliability (for example, dielectric breakdown resistance) of the gate insulating film 4, leading to an improvement in the reliability of the semiconductor device.

This Embodiment can be applied to Embodiment 2. In this case, it is only necessary to constitute the region of the polycrystalline silicon film 5c in Embodiment 2, which is in the vicinity of the interface with the gate insulating film 4, from polycrystalline silicon having no impurity introduced therein (that is, nondoped polycrystalline silicon) as in the polycrystalline silicon area 5f of this Embodiment. Alternatively, it is possible to form a non-doped polycrystalline silicon film (corresponding to the polycrystalline silicon area 5f), an impurity-doped polycrystalline silicon film (corresponding to the polycrystalline silicon area 5g) and a non-doped polycrystalline silicon film (corresponding to the polycrystalline silicon area 5h) over the gate insulating film 4, while regarding the polycrystalline silicon areas 5f, 5g and 5h as each independent film, and then forming the tungsten silicide film 6 over them.

Embodiment 4

FIGS. 25 to 29 are fragmentary cross-sectional views of a semiconductor device according to a still further embodiment of the present invention during its manufacturing steps. In this embodiment, a description will be made of the manufacturing steps of a semiconductor device having a flash memory (for example, a flash memory built-in microcomputer).

Figure 25:
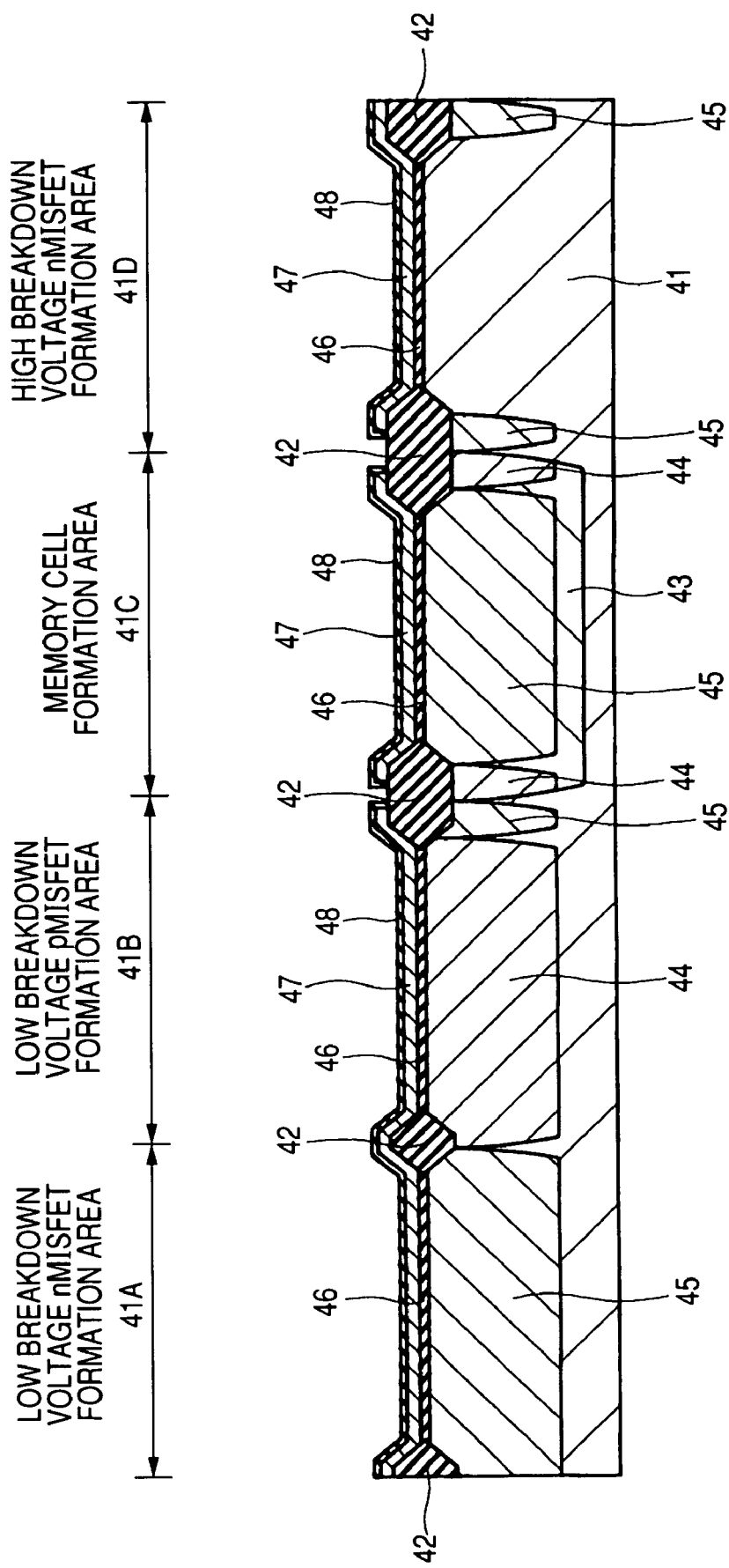
FIG. 25 is a fragmentary cross-sectional view of a semiconductor device according to a still further embodiment of the present invention during a manufacturing step thereof.

As illustrated in FIG. 25, a semiconductor substrate 41 over which the semiconductor device of this Embodiment is to be fabricated has, for example, an area 41A in which a 3.3V n channel MISFET (nMISFET) is to be formed (low breakdown voltage nMISFET formation area 41A), an area 41B in which a 3.3V p channel MISFET (pMISFET) is to be formed (low breakdown voltage pMISFET formation area 41B), an area 41C in which an MISFET to be a memory cell of a flash memory is to be formed (memory cell formation area 41C) and an area 41D in which a high voltage booster n channel MISFET is to be formed (high breakdown voltage nMISFET formation area 41D).

As illustrated in FIG. 24, field insulating films 42 for element isolation are formed by a selective oxidation method over the main surface of a semiconductor substrate (semiconductor wafer) 41 made of, for example, p type single crystal silicon, followed by the formation of an n type isolation region (n type semiconductor region) 43, n wells (n type semiconductor regions) 44 and p wells (p type semiconductor regions) 45 by ion implantation or the like.

A gate insulating film 46 made of a thin silicon oxide film is formed over the surface of n wells 44, p wells 45 and an exposed portion of the semiconductor substrate 41. The insulating film 46 can be formed, for example, by thermal oxidation. The thickness of the gate insulating film 46 in the area 41C is relatively thinner than that of the gate insulating film 46 in the areas 41A, 41B and 41D. Such a thinner film can be formed by etching the gate insulating film 46 in the area 41C or by constituting the gate insulating film 46 in the area 41C from a silicon oxide film that is different from the gate insulating film 46 in the areas 41A, 41B, 41D.

Then, a non-doped polycrystalline silicon film 47 is formed over the main surface of the semiconductor substrate 1. An impurity such as phosphorus (P) is introduced into the polycrystalline silicon film 47, for example, by ion implantation. The polycrystalline silicon film 47 is then patterned by photolithography and dry etching.

Figure 26:
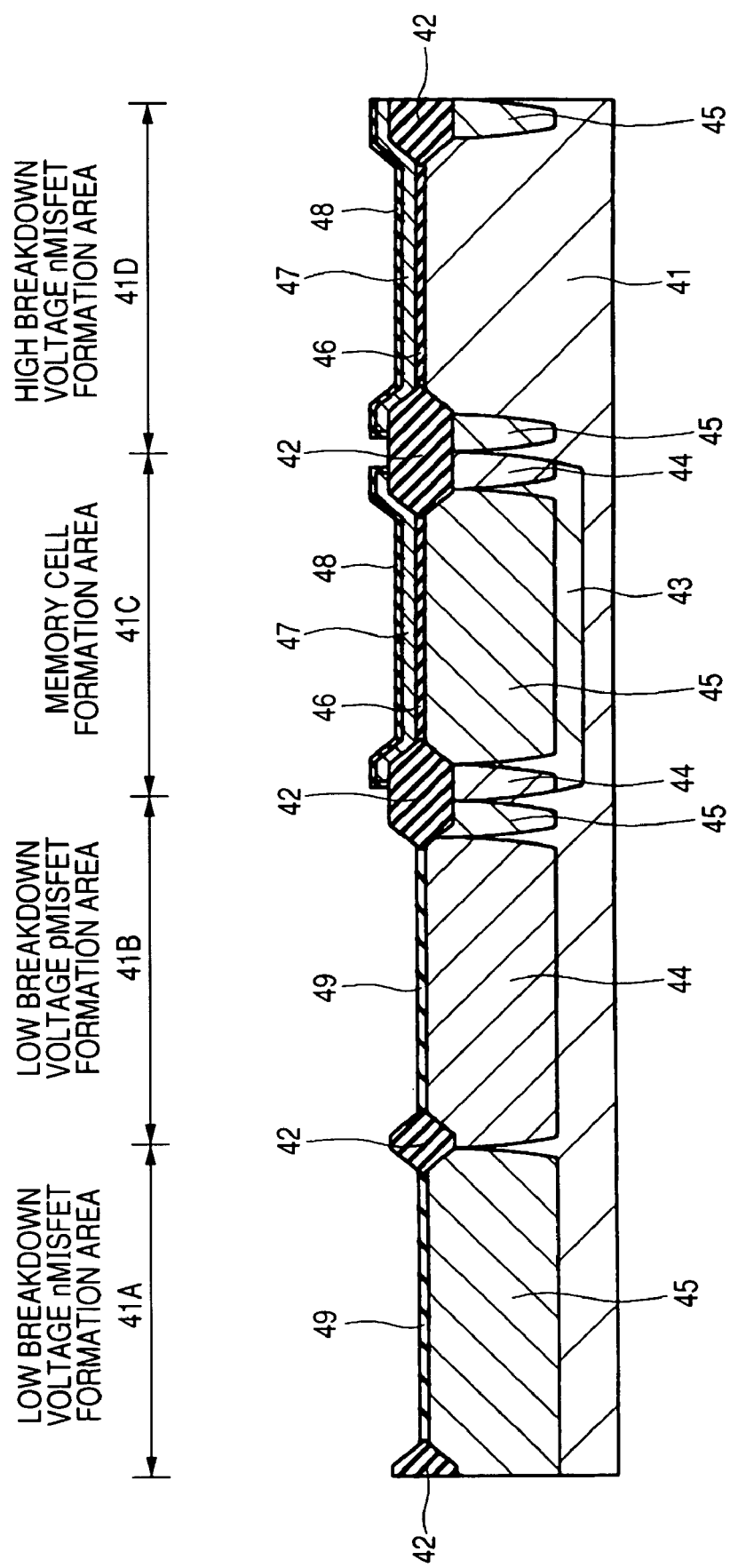
FIG. 26 is a fragmentary cross-sectional view of the semiconductor device during a manufacturing step following that of FIG. 25.

Over the semiconductor substrate 41 (that is, over the polycrystalline silicon film 47), an insulating film 48 having a stack structure of a silicon oxide film, a silicon nitride film, a silicon oxide film, a silicon nitride film and a silicon oxide film is formed. The silicon oxide films of the insulating film 48 can be formed, for example, by oxidation treatment (heat oxidation treatment), while the silicon nitride films can be formed, for example, by CVD. As illustrated in FIG. 26, the insulating film 48 and polycrystalline silicon film 47 are removed from the areas 41A and 41B by photolithography and dry etching. In the p well 45 of the area 41A and the n well 44 of the area 41B, $BF_2$ or the like is introduced (ion implanted).

Figure 27:
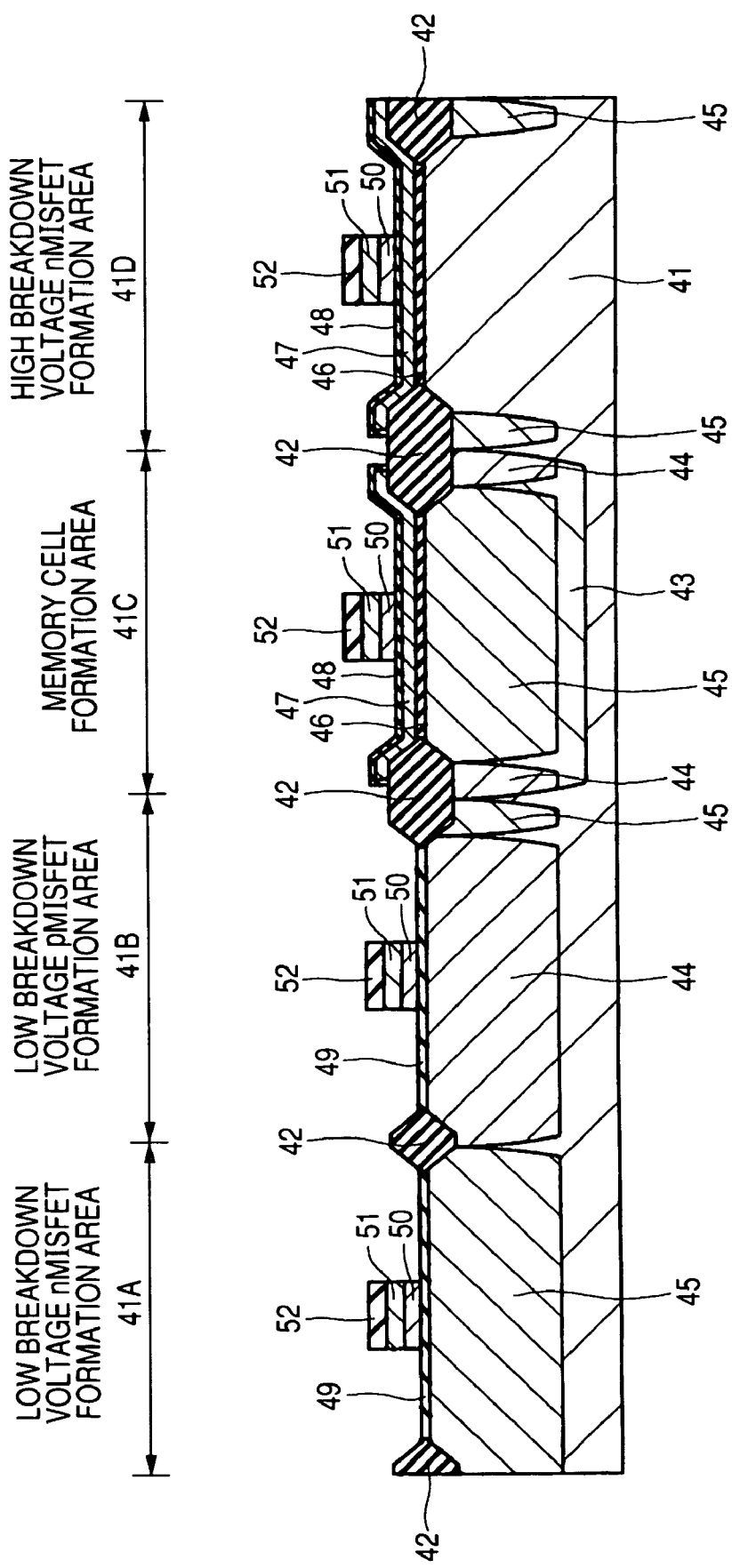
FIG. 27 is a fragmentary cross-sectional view of the semiconductor device during a manufacturing step following that of FIG. 26.
Figure 28:
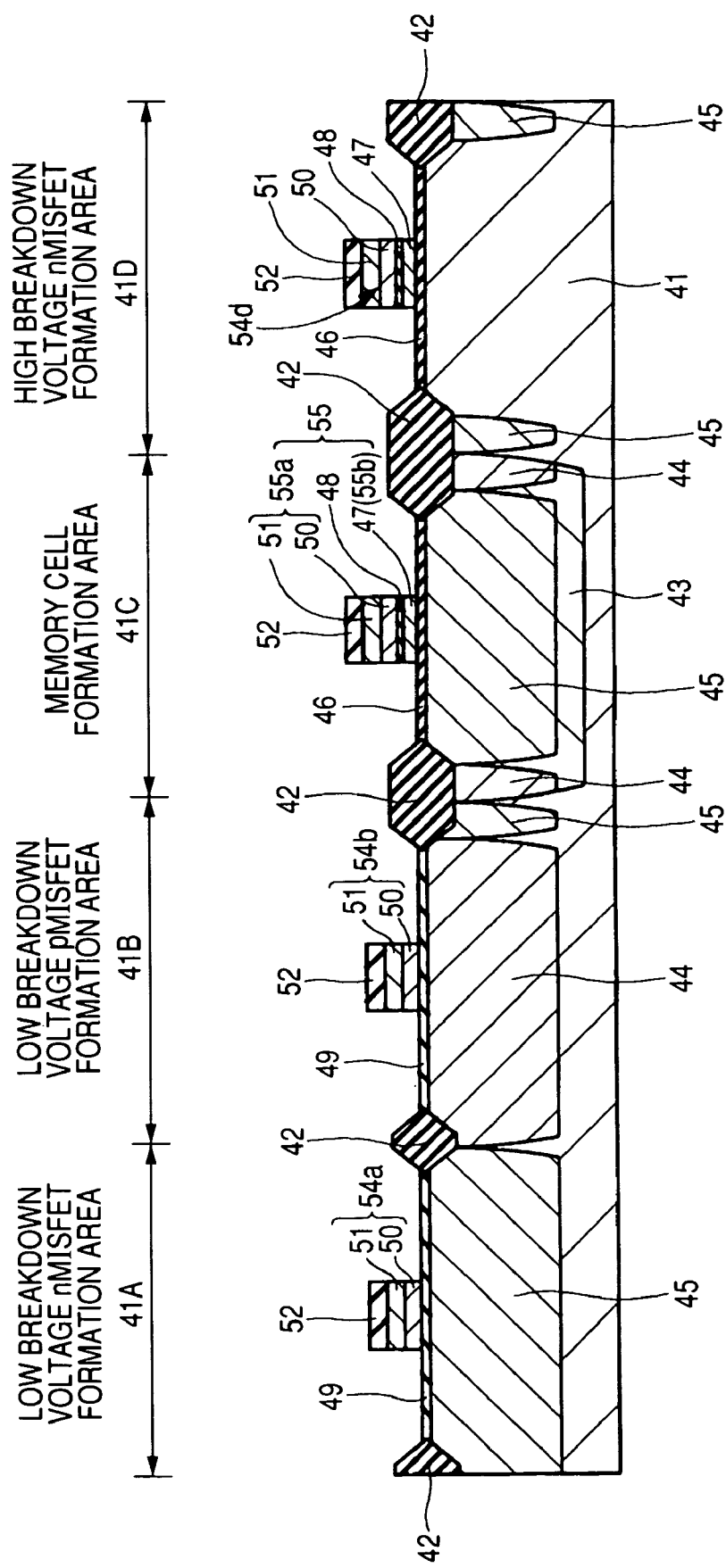
FIG. 28 is a fragmentary cross-sectional view of the semiconductor device during a manufacturing step following that of FIG. 27.

As illustrated in FIG. 27, the gate insulating film 46 is removed from the areas 41A and 41B, followed by oxidation treatment on the surface of the semiconductor substrate 41, whereby a gate insulating film 49 made of a thin oxide film or the like is formed over the surface of the p well 45 in the area 41A and the surface of the n well 44 in the area 41B.

Then, a polycrystalline silicon film 50, a tungsten silicide film 51 and a silicon oxide film 52 are deposited successively over the main surface of the semiconductor substrate 41.

In this Embodiment, the polycrystalline silicon film 50 and tungsten silicide film 51 are formed in a similar manner to that employed for the polycrystalline silicon film 5 and tungsten silicide film 6 in Embodiment 1. More specifically, the impurity (for example, phosphorus (P)) concentration distribution of the polycrystalline silicon film 50 in its thickness direction is adjusted as illustrated in the graph of FIG. 3 of Embodiment 1 by constituting the lower layer portion and inside region of the polycrystalline silicon film 50 from polycrystalline silicon having an impurity (for example, phosphorus (P)) introduced (doped) therein; and the upper layer portion (region in the vicinity of the upper surface) of the polycrystalline silicon film 50 from polycrystalline silicon having no impurity introduced therein, that is, non-doped polycrystalline silicon. In addition, the resistivity of the tungsten silicide film 51 upon film formation (as-deposition) is adjusted to exceed 1000 μΩcm. The polycrystalline silicon film 50 may also be formed in a similar manner to that employed for the film stack of the polycrystalline silicon films 5c and 5d in Embodiment 2, or the polycrystalline silicon film 5e in Embodiment 3.

The silicon oxide film 52 is then patterned by photolithography and dry etching. Using the patterned silicon oxide film 52 as an etching mask, the tungsten silicide film 51 and polycrystalline silicon film 50 are patterned by dry etching, whereby the structure as illustrated in FIG. 27 can be obtained.

After the areas 41A and 41B are covered with a photoresist pattern, which is not illustrated, the exposed portions of the insulating film 48 and polycrystalline silicon film 47 are removed by dry etching from the areas 41C and 41D using the patterned silicon oxide film 52 as an etching mask. By this etching, gate electrodes 54a and 54b made of the polycrystalline silicon film 50 and tungsten silicide film 51 are formed in the areas 41A and 41B, while a control gate electrode 55a made of the polycrystalline silicon film 50 and tungsten silicide film 51 and a floating gate electrode 55b made of the polycrystalline silicon film 47 are formed in the area 41C. In the area 41D, a gate electrode 54d made of the polycrystalline silicon film 50 and tungsten silicide film 51 are formed. The floating gate 55b, control gate electrode 55a and insulating film 48 therebetween are called "gate electrode 55", collectively. The semiconductor substrate 41 is then subjected to heat treatment (light oxidation treatment) in an oxygen-containing atmosphere (for example, in a dry oxygen atmosphere).

In this Embodiment, as in Embodiments 1 to 3, it is possible to suppress or prevent oxidation (W oxidation, abnormal oxidation) of tungsten on the sidewalls of each of the gate electrodes 54a, 54b, 54d, and 55 upon heat treatment (light oxidation), because a region of the polycrystalline silicon film 50 in the vicinity of the interface with the tungsten silicide film 51 is formed from polycrystalline silicon having no impurity introduced therein, that is, non-doped polycrystalline silicon, and the tungsten silicide film 51 is formed so that the resistivity of the tungsten silicide film 51 upon formation (as-deposition) exceeds 1000 μΩcm.

Similar advantages to those of Embodiments 1 to 3 are therefore available and the reliability of the semiconductor device can be improved. The resistivity of the tungsten silicide film 51 lowers owing to the recrystallization of the tungsten silicide film 51 upon heat treatment (light oxidation) and it becomes 400 μΩcm or less, more preferably 200 to 300 μΩcm. The resistance of the gate electrode can therefore be reduced.

Figure 29:
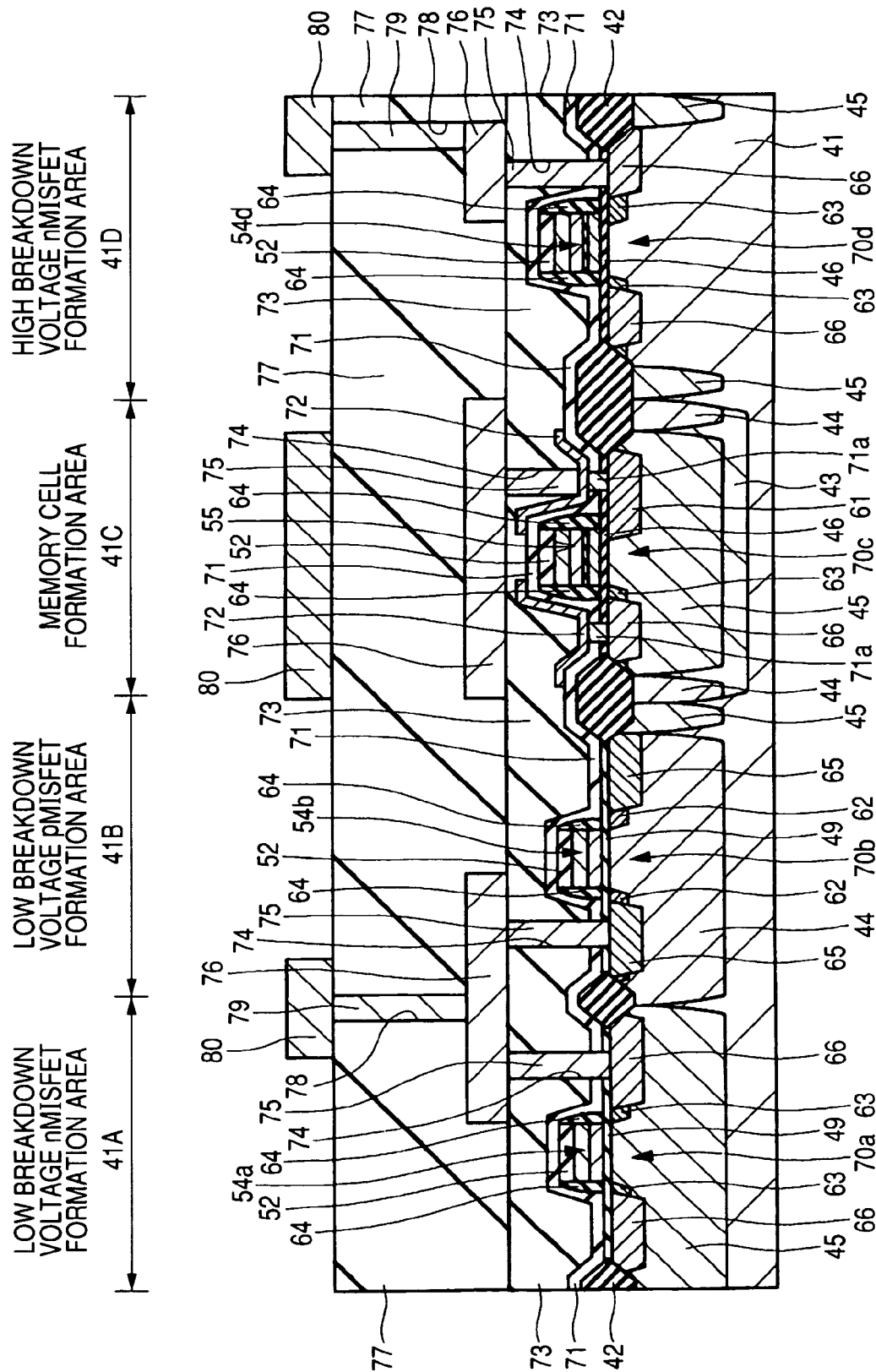
FIG. 29 is a fragmentary cross-sectional view of the semiconductor device during a manufacturing step following that of FIG. 28.

As illustrated in FIG. 29, an n type semiconductor region 61 is formed by implanting ions of an n type impurity (for example, phosphorus (P)) in a region on one side of the gate electrode 55 in the area 41C; $p^-$ type semiconductor regions 62 are formed by implanting ions of a p type impurity (for example, $BF_2$) in regions on both sides of the gate electrode 54b in the area 41B; and $n^-$ type semiconductor regions 63 are formed by implanting ions of an n type impurity (for example, P) in regions on both sides of each of the gate electrodes 54a and 54d in the areas 41A and 41D, respectively, and in a region on the other side of the gate electrode 55 in the area 41C. A silicon oxide film is then deposited over the semiconductor substrate 41, followed by anisotropic etching of the silicon oxide film to leave it on the sidewalls of each of the gate electrodes 54a, 54b, 54d and 55 and form sidewall spacers 64.

After formation of the sidewall spacers 64, $p^+$ type semiconductor regions (source and drain) 65 are formed by implanting ions of a p type impurity (for example, $BF_2$) in regions on both sides of the gate electrode 54b and its sidewall spacers 64 in the area 41B, while $n^+$ type semiconductor regions (source and drain) 66 are formed by implanting ions of an n type impurity (for example, P) in regions on both sides of each of the gate electrodes 54a and 54d and sidewall spacers 64 thereof in the areas 41A and 41D, respectively, and in a region (in a region on the side on which the n type semiconductor region 61 has not been formed) on the other side of the gate electrode 55 and sidewall spacers 64 thereof in the area 41C. The $p^+$ type semiconductor regions 65 have an impurity concentration higher than that of the $p^-$ type semiconductor regions 62, while the $n^+$ type semiconductor regions 66 have an impurity concentration higher than that of the $n^-$ type semiconductor regions 63.

In such a manner, the 3.3V n channel MISFET 70a, 3.3V p channel MISFET 70b, MISFET 70c to serve as a memory cell of a flash memory and high voltage booster n channel MISFET 70d are formed in the areas 41A, 41B, 41C and 41D, respectively.

A silicon oxide film 71 is then formed over the semiconductor substrate 41, for example, by CVD, followed by the formation of a contact hole 71a, which reaches the n type semiconductor region 61, in the silicon oxide film 71 by photolithography and dry etching. A polycrystalline silicon film 72 having an impurity (for example, phosphorus (P)) introduced (doped) therein is deposited over the semiconductor substrate 41, for example, by CVD to embed the polycrystalline silicon film 72 in the contact hole 71a. By photolithography and dry etching, the polycrystalline silicon film 72 is patterned. The patterned polycrystalline silicon film 72 can function as an interconnect.

Over the semiconductor substrate 41, a BPSG (Boro-Phospho Silicate Glass) film 73 is formed, for example, by CVD and its upper surface is planarized by heat treatment. A contact hole (through-hole) 74 is then formed in the BPSG film 73, followed by the formation of a plug (for example, tungsten plug) 75 to embed therewith the contact hole 74. An interconnect (for example, aluminum interconnect) 76 is formed over the BPSG film 73 having the plug 75 embedded therein.

An interlevel insulating film 77 made of a silicon oxide film is formed over the BPSG film 73 to cover the interconnect 76. A through-hole 78 is formed in the interlevel insulating film 77. A plug (for example, tungsten plug) 79 is formed to embed the through-hole 78. Over the interlevel insulating film 77 having the plug 79 embedded therein, an interconnect (for example, aluminum interconnect) 80 is formed. Formation steps of interlevel insulating films and upper interconnect layers follow, but a description thereof is omitted here.

Also in this Embodiment, similar advantages to those available by Embodiments 1 to 3 can be obtained. For example, it is possible to suppress or prevent oxidation (abnormal oxidation) of tungsten on the sidewalls of the gate electrode and thereby to suppress or prevent the destruction of the gate insulating film. Moreover, the reliability of the semiconductor device can be improved (degradation failures can be reduced) and the production yield can be improved. By this improvement in the reliability, the time necessary for a reliability evaluation test can be shortened.

Embodiment 5

FIGS. 30 to 33 are fragmentary cross-sectional views of a semiconductor device according to a still further embodiment of the present invention during its manufacturing steps. In this Embodiment, a description will be made of manufacturing steps in the fabrication of a DRAM (Dynamic Random Access Memory). In each of FIGS. 30 to 33 illustrating the cross-section of a semiconductor substrate, a region in which a memory cell of a DRAM is to be formed (memory cell formation area (MCFA)) is shown on the left side, while a logic circuit formation area (LCVA) in which a logic circuit and the like are formed is shown on the right side.

A memory cell composed of a data transfer MISFET (memory cell selecting MISFET) and data storage capacitor is formed in this memory cell formation area, while an n channel MISFET and p channel MISFET constituting the logic circuit is formed in the logic circuit formation area.

Figure 30:
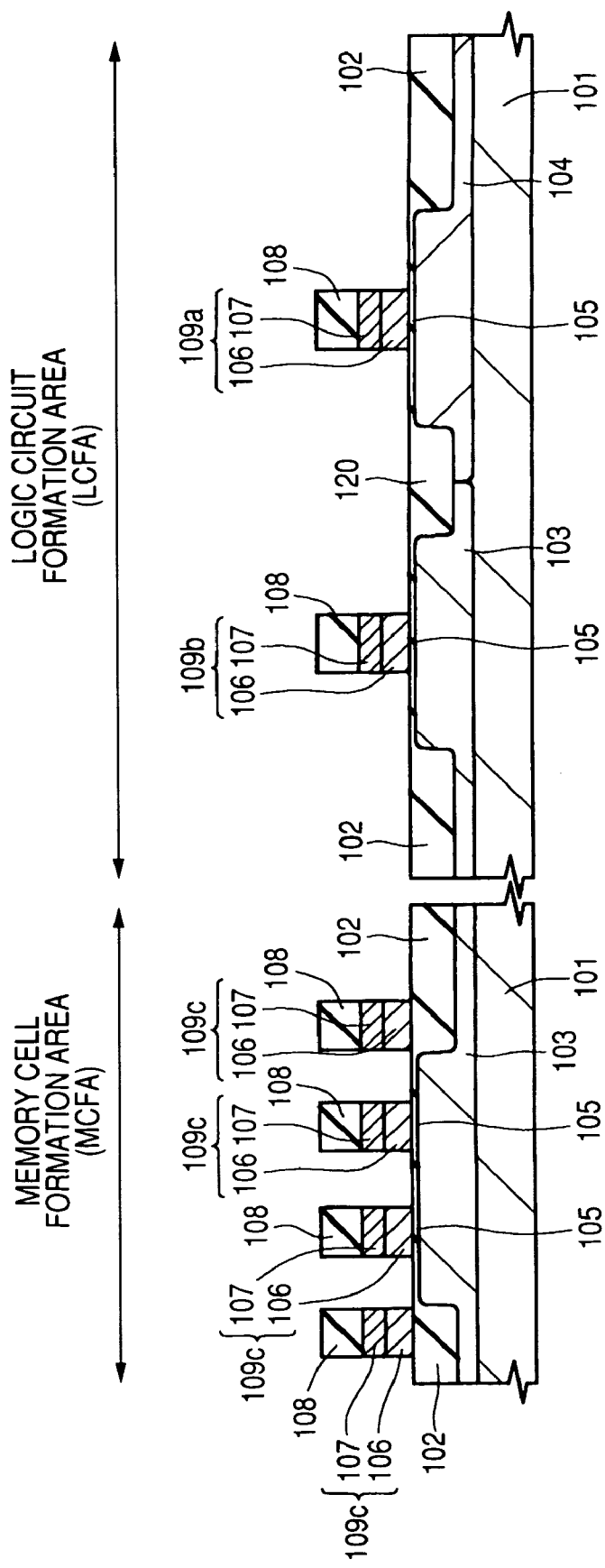
FIG. 30 is a fragmentary cross-sectional view of a semiconductor device according to a still further embodiment of the present invention during a manufacturing step thereof.

As illustrated in FIG. 30, element isolation regions 102 made of silicon oxide or the like are formed in a semiconductor substrate (semiconductor wafer) 101 made of, for example, p type single crystal silicon by the STI (Shallow Trench Isolation) method. After ion implantation of a p type impurity (for example, boron (B)) and n type impurity (for example, phosphorus (P)) in the semiconductor substrate 101, these impurities are diffused by heat treatment, whereby a p well 103 is formed in the semiconductor substrate 101 in the memory cell formation area, while a p well 103 and an n well 104 are formed in the semiconductor substrate 101 in the logic circuit formation area.

The surface of the semiconductor substrate 101 (p well 103 and n well 104) is wet washed with a hydrofluoric acid cleaning solution, followed by the formation of a gate insulating film 105 made of a clean silicon oxide film over the surface of the p well 103 and n well 104 by the thermal oxidation method.

A polycrystalline silicon film 106, a tungsten silicide film 107 and a silicon nitride film 108 are successively formed over the semiconductor substrate 101, more specifically, the gate insulating film 105.

In this Embodiment, the polycrystalline silicon film 106 and tungsten silicide film 107 are formed in a similar manner to that employed for the formation of the polycrystalline silicon film 5 and tungsten silicide film 6 in Embodiment 1. More specifically, the impurity (for example, phosphorus (P)) concentration distribution of the polycrystalline silicon film 106 in its thickness direction is adjusted as illustrated in the graph of FIG. 3 of Embodiment 1 by constituting the lower layer portion and inside region of the polycrystalline silicon film 106 from polycrystalline silicon introduced (doped) with an impurity (for example, phosphorus (P)) and the upper layer portion (region in the vicinity of the upper surface) of the polycrystalline silicon film 106 from polycrystalline silicon having no impurity introduced therein, that is, non-doped polycrystalline silicon. In addition, the resistivity of the tungsten silicide film 107 upon film formation (as-deposition) is adjusted to exceed 1000 μΩcm. The polycrystalline silicon film 106 can also be formed in a similar manner to that employed for the film stack of the polycrystalline silicon films 5c and 5d in Embodiment 2, or the polycrystalline silicon film 5e in Embodiment 3.

The silicon nitride film 108, tungsten silicide film 107, and polycrystalline silicon film 106 are then patterned by photolithography and dry etching, whereby gate electrodes 109a, 109b, and 109c, each made of the polycrystalline silicon film 106 and tungsten silicide film 107, are formed. The gate electrode 109a is formed over the n well 104 in the logic circuit formation area, the gate electrode 109b is formed over the p well 103 in the logic circuit formation area, and the gate electrode 109c is formed over the p well 103 in the memory cell formation area. Over these gate electrodes 109a, 109b, and 109c, a cap insulating film made of the silicon nitride film 108 is formed. The gate electrode 109c formed in the memory cell formation area functions as a word line WL. Then, heat treatment (light oxidation treatment) is performed in an oxygen-containing atmosphere (for example, dry oxygen atmosphere).

In this Embodiment, it is possible to suppress or prevent oxidation (W oxidation, abnormal oxidation) of tungsten over the sidewalls of each of the gate electrodes 109a, 109b and 109c upon heat treatment (light oxidation treatment), because a region of the polycrystalline silicon film 106 in the vicinity of the interface with the tungsten silicide film 107 is made of polycrystalline silicon having no impurity implanted therein, that is, non-doped polycrystalline silicon, and the resistivity of the tungsten silicide film 107 upon formation (as-deposition) is adjusted to exceed 1000 μΩcm. Advantages similar to those in Embodiments 1 to 3 are available and the reliability of the semiconductor device can be improved. Upon heat treatment (light oxidation treatment), recrystallization of the tungsten silicide film 107 occurs, which reduces its resistivity. The resistivity of the tungsten silicide film 107 lowers to 400 μΩcm, preferably 200 to 300 μΩcm and the resistance of the gate electrode can be reduced.

Figure 31:
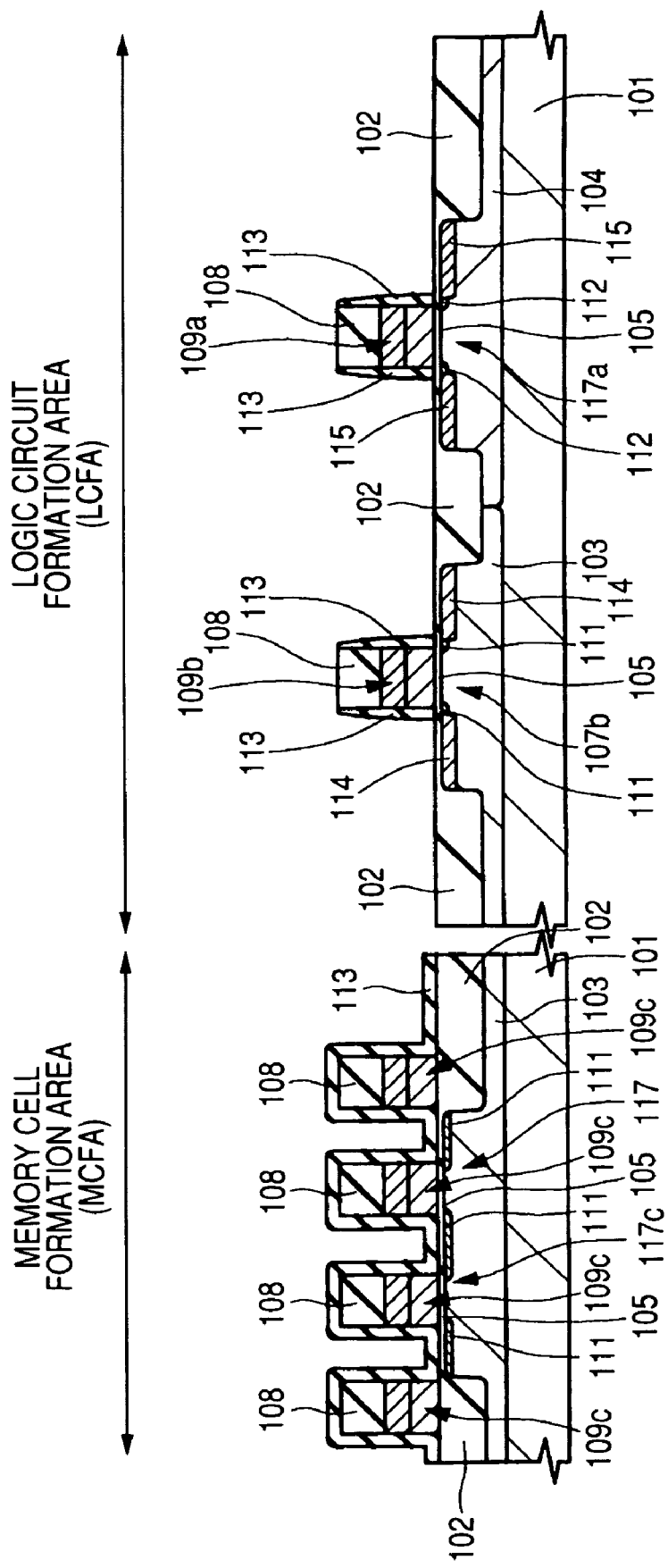
FIG. 31 is a fragmentary cross-sectional view of the semiconductor device during a manufacturing step following that of FIG. 30.

As illustrated in FIG. 31, phosphorus (P) ions are implanted in regions of the p well 103 on both sides of each of the gate electrodes 109b and 109c to form n⁻ type semiconductor regions 111 (source and drain). Boron fluoride (BF) ions are implanted in regions of the n well 104 on both sides of the gate electrode 109a to form p⁻ type semiconductor regions 112 (source and drain) are formed.

After deposition of a silicon nitride film 113 over the semiconductor substrate 101 by CVD, the silicon nitride film 113 in the logic circuit formation area is anisotropically etched while covering the upper portion of the semiconductor substrate 101 in the memory cell formation area with a resist film (not illustrated), whereby sidewall spacers are formed on the sidewalls of each of the gate electrodes 109a and 109 in the logic circuit formation area. By implanting arsenic (As) ions in regions of the p well 103 on both sides of the gate electrode 109b in the logic circuit formation area, n+ type semiconductor regions 114 (source and drain) are formed, while by implanting boron fluoride (BF) ions in regions of the n well 104 on both sides of the gate electrode 109a of the logic circuit formation area, p+ type semiconductor regions 115 (source and drain) are formed.

In the above-described manner, the p channel MISFET 117a and n channel MISFET 117b, each equipped with a source and drain of LDD (Lightly Doped Drain) structure, are formed in the logic circuit formation area, while the data transfer MISFET 117c composed of an n channel MISFET is formed in the memory cell formation area.

Figure 32:
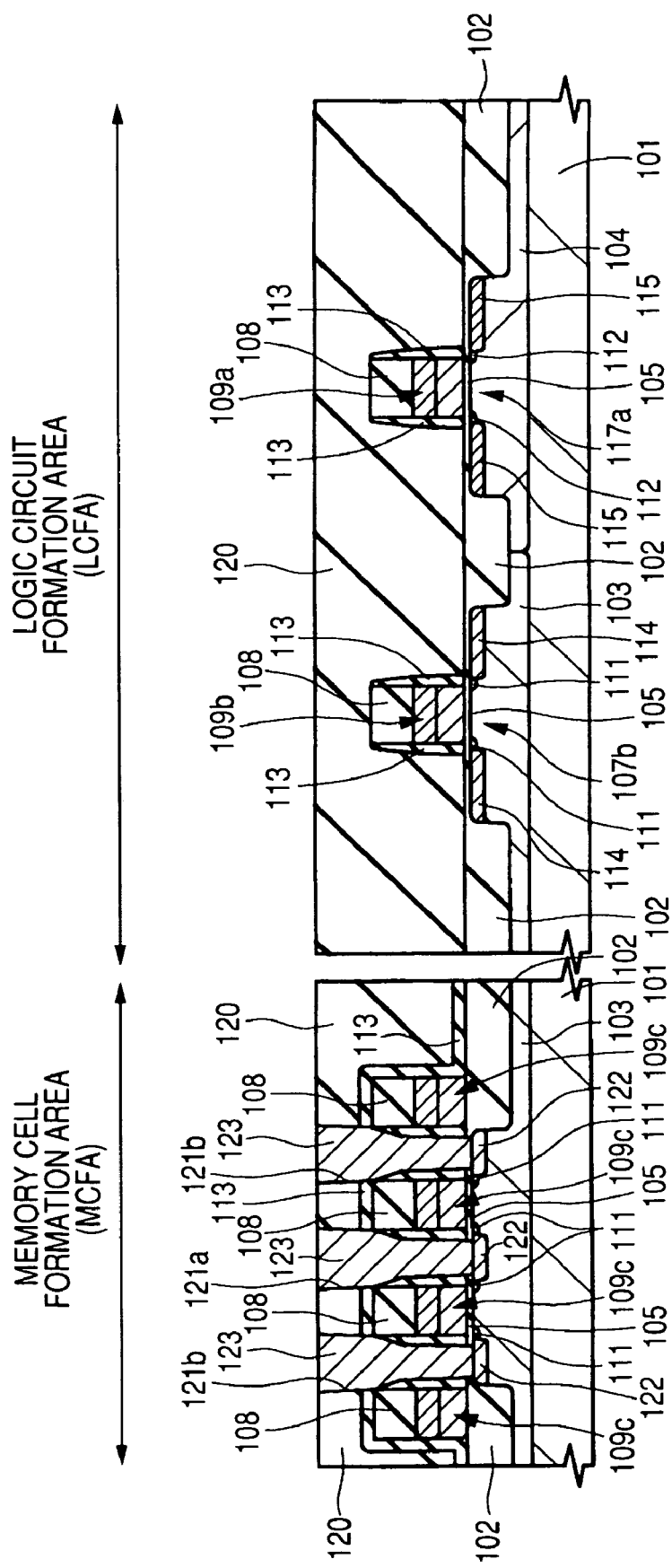
FIG. 32 is a fragmentary cross-sectional view of the semiconductor device during a manufacturing step following that of FIG. 31.

As illustrated in FIG. 32, a silicon oxide film 120 consisting of a film stack of, for example, an SOG (Spin On Glass) film and a TEOS oxide film is formed over the semiconductor substrate 101. Using a resist film (not illustrated) as an etching mask, the silicon oxide film 120 over the n− type semiconductor regions 111 in the memory cell formation area is dry etched to expose the surface of the silicon nitride film 113. By dry etching of the exposed silicon nitride film 113, contact holes 121a and 121b are formed over the n− type semiconductor regions 111. Via the contact holes 121a and 121b, ions such as arsenic (As) ions are implanted to form n+ type semiconductor regions 122 (source and drain). A plug 123 made of polycrystalline silicon doped with an impurity (such as phosphorus (P)) is formed inside of each of the contact holes 121a and 121b. This plug 123 can also be made of a film stack formed of a metal nitride film such as titanium nitride or tungsten nitride and a refractory metal film such as tungsten. It is also possible to embed a portion of each of the contact holes 121a and 121b with the plug 123 made of a polycrystalline silicon film first and then in a step of forming a plug 126, which will be described later, a film stack of a metal nitride film and a refractory metal film as described above is formed to embed therewith the remaining portion of each of the contact holes 121a and 121b.

Figure 33:
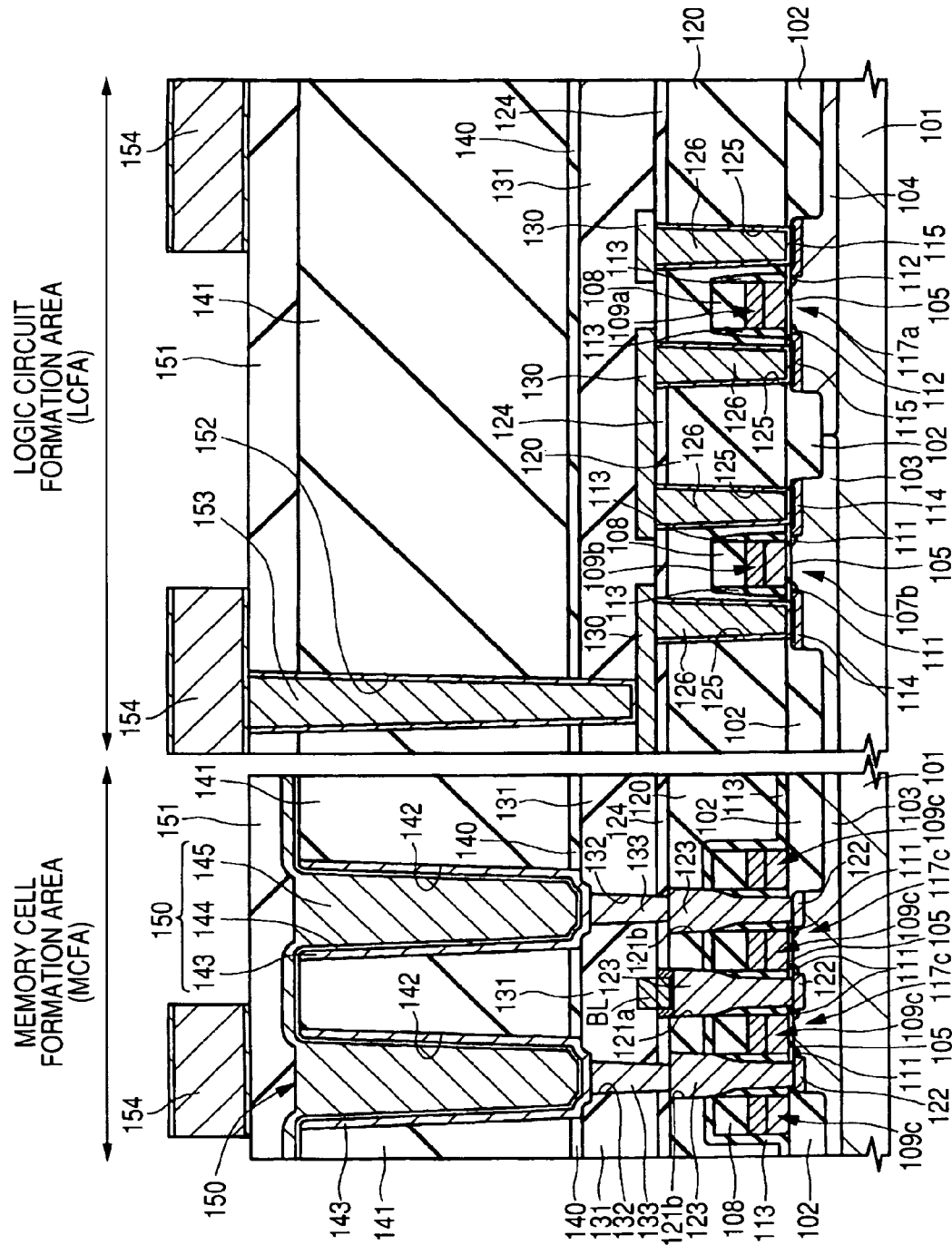
FIG. 33 is a fragmentary cross-sectional view of the semiconductor device during a manufacturing step following that of FIG. 32.

As illustrated in FIG. 33, after formation of a silicon oxide film 124 over the silicon oxide film 120, the silicon oxide film 124 and the underlying silicon oxide film 120 in the logic circuit formation area are dry etched to form contact holes 125 over the n+ type semiconductor regions 114 and p+ type semiconductor regions 115. Inside of each of the contact holes 125, the plug 126 consisting of a film stack of a metal nitride film such as titanium nitride or tungsten nitride and a refractory metal film such as tungsten is formed. A bit line BL is formed over the silicon oxide film 124 in the memory cell formation area, while a first-level interconnect 130 is formed over the silicon oxide film 124 in the logic circuit formation area. The bit line BL and interconnect 130 are made of, for example, tungsten. This bit line BL may be composed of a film stack of a metal nitride film such as titanium nitride or tungsten nitride and a refractory metal film such as tungsten. The bit line BL is disposed over the data transfer MISFET 117c (memory cell selecting MISFET) and is electrically connected via the plug 123 to the source/drain regions (regions functioning as source or drain and in this Embodiment, they mean n− type semiconductor regions 111 and n+ type semiconductor regions 122) of the data transfer MISFET 117c (memory cell selecting MISFET).

A silicon oxide film 131 is then formed over the semiconductor substrate 101. The silicon oxide film 131 and underlying silicon oxide film 124 in the memory cell formation area are dry etched to form a through-hole 132 over the plug 123 in the contact hole 121b. Inside of the through-hole 132, a plug 133 made of polycrystalline silicon doped with an impurity (for example, phosphorus (P)) is formed. This plug 133 may be composed of a film stack of a metal nitride film such as titanium nitride or tungsten nitride and a refractory metal film such as tungsten.

A silicon nitride film 140 and a silicon oxide film 141 are then formed successively over the semiconductor substrate 101. By dry etching of the silicon oxide film 141 and silicon nitride film 140 in the memory cell formation area, a trench 142 is formed over the plug 133. A polycrystalline silicon film 143 doped with an impurity (for example, phosphorus (P)) is formed over the inside wall of the trench 142. The polycrystalline silicon film 143 can be left along the inside wall of the trench 142, for example, by forming the polycrystalline silicon film 143 over the silicon oxide film 141 including the inside of the trench 142, embedding the trench 142 with a resist film, etching back the polycrystalline silicon film 143 over the silicon oxide film 141 and then removing the resist film. This polycrystalline silicon film 143 serves as a lower electrode of a capacitor. Instead of the polycrystalline silicon film, a metal nitride film, such as a titanium nitride or tungsten nitride film, may be used for formation of the lower electrode 143.

Over the silicon oxide film 141 including the inside of the trench 142, a tantalum oxide ($Ta_2O_5$) film 144 to be used as a capacitor insulating film of a capacitor is formed. Over the tantalum oxide film 144 including that inside of the trench 142, a titanium nitride (TiN) film 145 is deposited. By patterning the titanium nitride film 145 and tantalum oxide film 144, a capacitor (data-storing capacitor) 150 composed of an upper electrode made of the titanium nitride film 145, a capacitor insulating film made of the tantalum oxide film 144 and a lower electrode made of the polycrystalline silicon film 143 is formed. The capacitor 150 is disposed over the data transfer MISFET 117c (memory cell selecting MISFET) and the lower electrode 143 of the capacitor 150 is electrically connected to the source/drain region (a region serving as a source or drain. n− semiconductor regions 111 and n+ type semiconductor regions 122 in this Embodiment) of the data transfer MISFET 117c via the plugs 123 and 133.

In the above-described manner, formation of a memory cell of a DRAM having the data transfer MISFET 117c and the capacitor 150 connected thereto in series is completed.

Over the semiconductor substrate 101, a silicon oxide film 151 is formed. After formation of a through-hole 152 by dry etching of the silicon oxide films 151 and 141, silicon nitride film 140 and silicon oxide film 131 over the interconnect 130 in the logic circuit formation area, a plug 153 is formed inside of the through-hole 152. A second-level interconnect 154 is then formed over the silicon oxide film 151 and plug 153. Formation of insulating films and upper-level interconnects follows, but a description thereof is omitted.

Also in this Embodiment, similar advantages to those obtained in Embodiments 1 to 4 are available. For example, it is possible to suppress or prevent oxidation (abnormal oxidation) of tungsten on the sidewalls of the gate electrode and thereby to suppress or prevent the destruction of the gate insulating film. Moreover, the reliability of the semiconductor device can be improved (deterioration defects can be reduced) and the production yield can be improved. By this improvement in the reliability, the time necessary for the reliability evaluation test can be shortened.

Embodiment 6

FIGS. 34 to 37 are fragmentary cross-sectional views of a semiconductor device according to a still further embodiment of the present invention during its manufacturing steps. In this embodiment, a description will be made of manufacturing steps of a semiconductor device having an LCD driver circuit for driving a liquid crystal display formed thereon.

Figure 34:
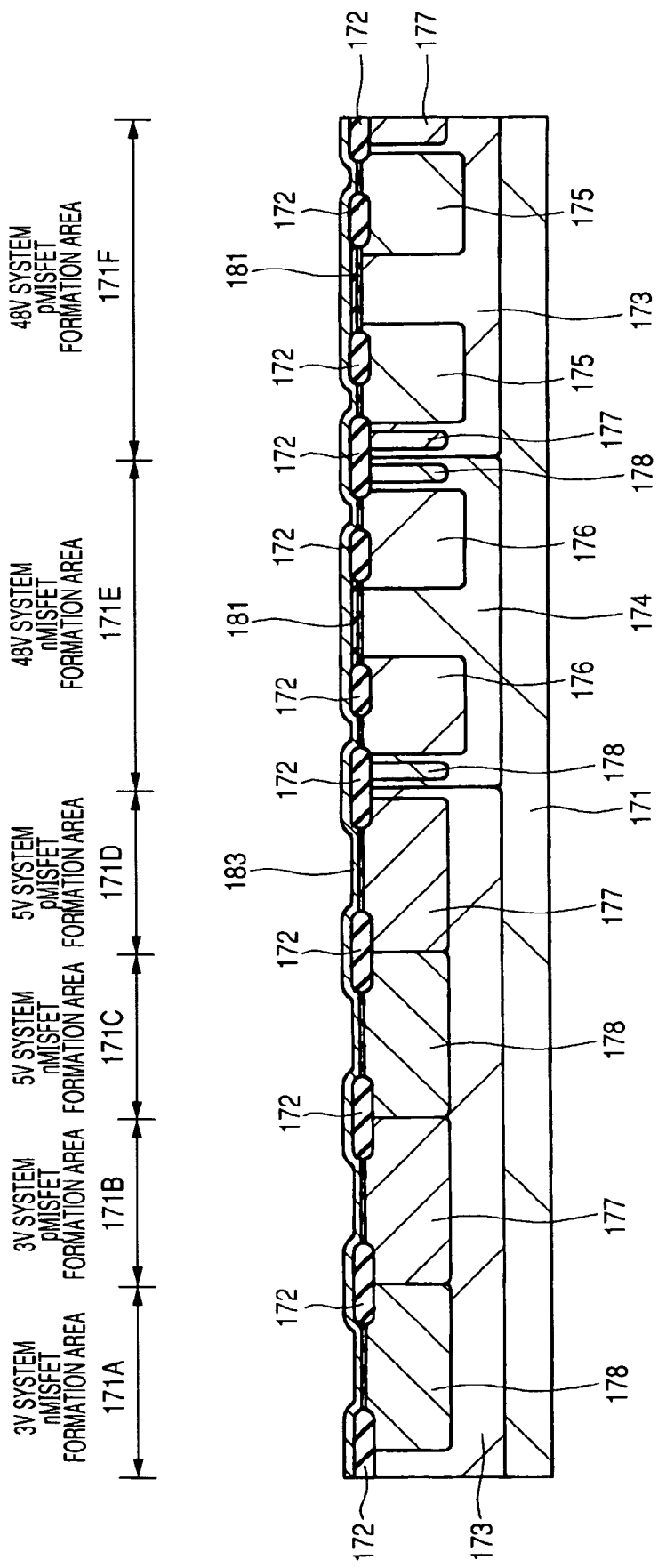
FIG. 34 is a fragmentary cross-sectional view of a semiconductor device according to a still further embodiment of the present invention during a manufacturing step thereof.

As illustrated in FIG. 34, a semiconductor substrate 171 over which a semiconductor device of this Embodiment is to be formed has, for example, a region 171A in which a 3V n channel MISFET is to be formed (3V nMISFET formation area 171A), a region 171B in which a 3V p channel MISFET is to be formed (3V pMISFET formation area 171B), a region 171C in which a 5V n channel MISFET is to be formed (5V nMISFET formation area 171C), a region 171D in which a 5V p channel MISFET is to be formed (5V pMISFET formation area 171D), a region 171E in which a 48V n channel MISFET is to be formed (48V nMISFET formation area 171E) and a region 171F in which 48V p channel MISFET is to be formed (48V pMISFET formation area 171F).

As illustrated in FIG. 34, field insulating films (field oxide films) 172 for element isolation are formed by a selective oxidation method over the main surface of the semiconductor substrate (semiconductor wafer) 171 made of, for example, p type single crystal silicon and by ion implantation or the like method, an n type isolation region (n type semiconductor region) 173, a high voltage p well (p type semiconductor region) 174, p type semiconductor regions 175, n type semiconductor regions 176, n well 177 and p well 178 are formed.

Figure 35:
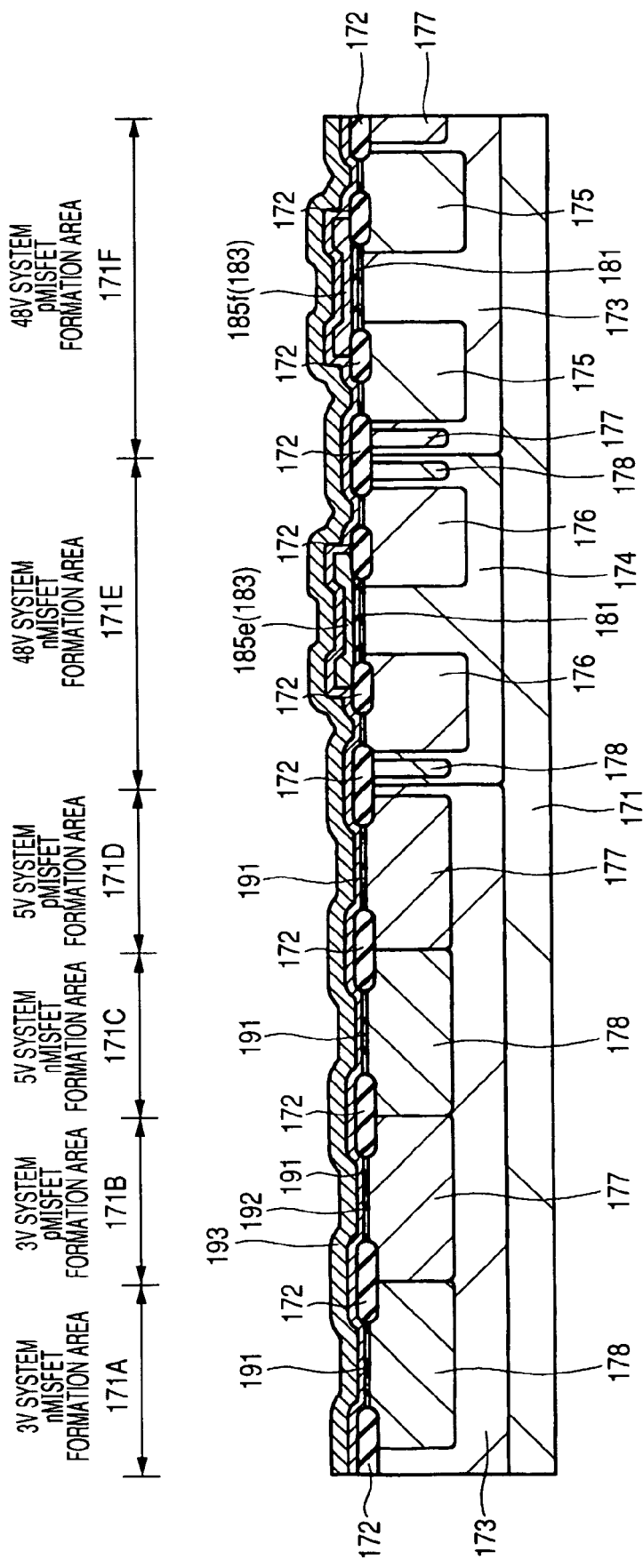
FIG. 35 is a fragmentary cross-sectional view of the semiconductor device during a manufacturing step following that of FIG. 34.

A thermal oxide film (silicon oxide film) is formed by the thermal oxidation method over portions (portions from which a silicon region is exposed) other than the field insulating films 172 over the main surface of the semiconductor substrate 171, followed by deposition of a silicon oxide film over the thermal oxide film to form a gate insulating film 181. By photolithography and dry etching, the gate insulating film 181 is removed from a region other than the gate electrode formation regions in the regions 171E and 171F. As illustrated in FIG. 35, a polycrystalline silicon film 183 having an impurity (for example, phosphorus (P)) doped therein is deposited over the semiconductor substrate 171 and the polycrystalline silicon film 183 is removed from a region other than the gate electrode formation region in the regions 171E and 171F by photolithography and dry etching, whereby gate electrodes 185e and 185f made of the polycrystalline silicon film 183 are formed in the regions 171E and 171F, respectively. Alternatively, after deposition of the polycrystalline silicon film 183, a silicon oxide film, a silicon nitride film and a silicon oxide film are formed over the polycrystalline silicon film 183, followed by the above-described dry etching.

A gate insulating film 191 made of, for example, a clean silicon oxide film is formed over the surface of the n well 177 and p well 178 after rinsing treatment, if necessary. The gate insulating film 191 is thinner than the gate insulating film 181. Over the semiconductor substrate 171, a polycrystalline silicon film 192 and a tungsten silicide film 193 are formed successively.

In this Embodiment, the polycrystalline silicon film 192 and tungsten silicide film 193 are formed in a similar manner to that employed for the formation of the polycrystalline silicon film 5 and tungsten silicide film 6 in Embodiment 1. More specifically, the impurity (for example, phosphorus (P)) concentration distribution of the polycrystalline silicon film 192 in its thickness direction is adjusted as illustrated in the graph of FIG. 3 of Embodiment 1 by constituting the lower layer portion and inside region of the polycrystalline silicon film 192 from polycrystalline silicon introduced (doped) with an impurity (for example, phosphorus (P)) and the upper layer portion (region in the vicinity of the upper surface) of the polycrystalline silicon film 192 from polycrystalline silicon having no impurity introduced therein, that is, non-doped polycrystalline silicon. In addition, the resistivity of the tungsten silicide film 193 upon film formation (as-deposition) is adjusted to exceed 1000 μΩcm. The polycrystalline silicon film 192 may also be formed in a similar manner to that employed for the film stack of the polycrystalline silicon films 5c and 5d in Embodiment 2, or the polycrystalline silicon film 5e in Embodiment 3.

Figure 36:
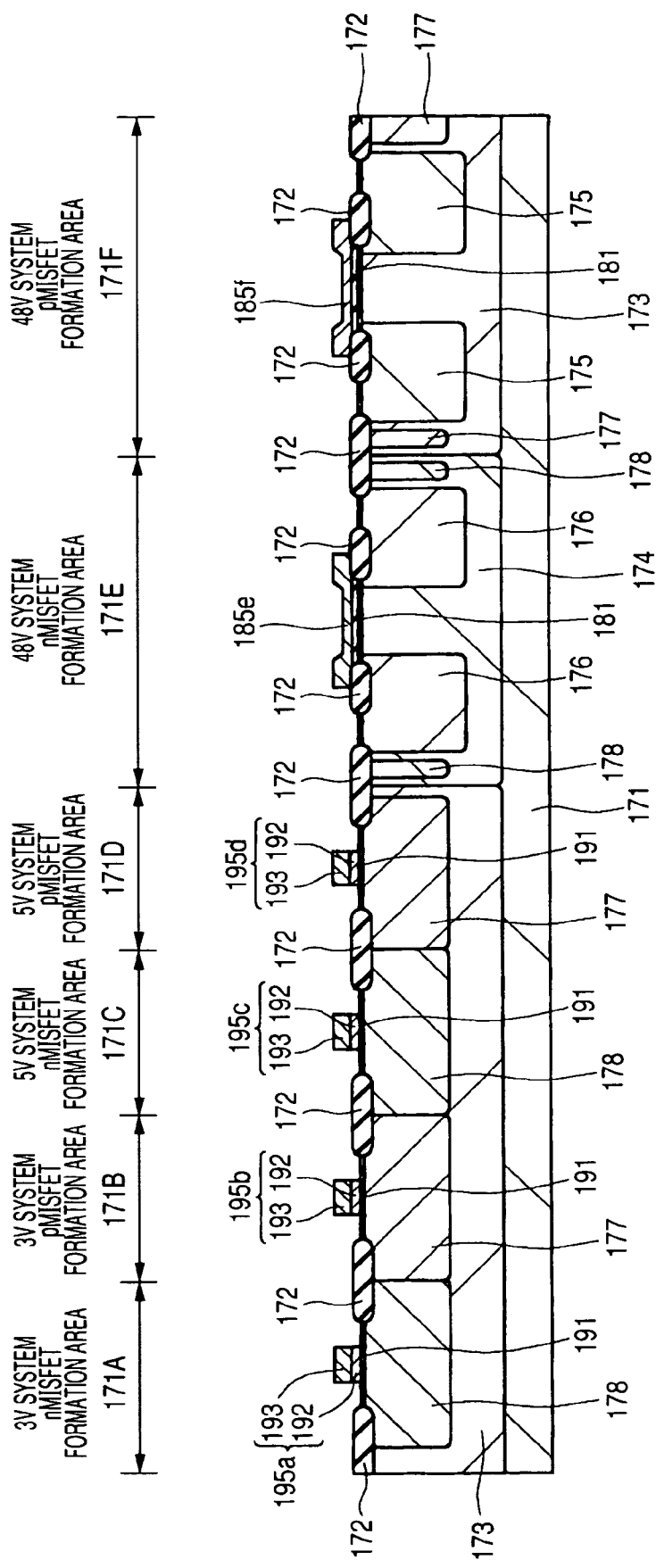
FIG. 36 is a fragmentary cross-sectional view of the semiconductor device during a manufacturing step following that of FIG. 35.

As illustrated in FIG. 36, the tungsten silicide film 193 and polycrystalline silicon film 192 are patterned by photolithography and etching to form gate electrodes 195a, 195b, 195c, and 195d each made of the polycrystalline silicon film 192 and tungsten silicide film 193 in regions 171A, 171B, 171C and 171D, respectively. Alternatively, it is also possible to form a protecting film (not illustrated) made of a silicon oxide film over the tungsten silicide film 193 and after formation, to perform the above-described patterning. In this case, a cap insulating film (not illustrated) made of the protecting film is formed over the gate electrodes 195a, 195b, 195c and 195d.

In an oxygen-containing atmosphere (for example, in a dry oxygen atmosphere), heat treatment (light oxidation) is conducted. In this Embodiment, it is possible to suppress or prevent oxidation (W oxidation, abnormal oxidation) of tungsten on the sidewalls of each of the gate electrodes 195a, 195b, and 195c upon heat treatment (light oxidation), because a region of the polycrystalline silicon film 192 in the vicinity of the interface with the tungsten silicide film 193 is made of polycrystalline silicon having no impurity introduced therein, that is, non-doped polycrystalline silicon, and the tungsten silicide film 193 is formed so that the resistivity of the tungsten silicide film 193 upon formation (as-deposition) exceeds 1000 μΩcm. Similar advantages to those of Embodiments 1 to 3 are available and the reliability of the semiconductor device can be improved. The resistivity of the tungsten silicide film 193 is lowered due to the recrystallization of the tungsten silicide film 193 upon heat treatment (light oxidation). It decreases to 400 μΩcm or less, more preferably to from 200 to 300 μΩcm. The resistance of the gate electrode can therefore be reduced.

Figure 37:
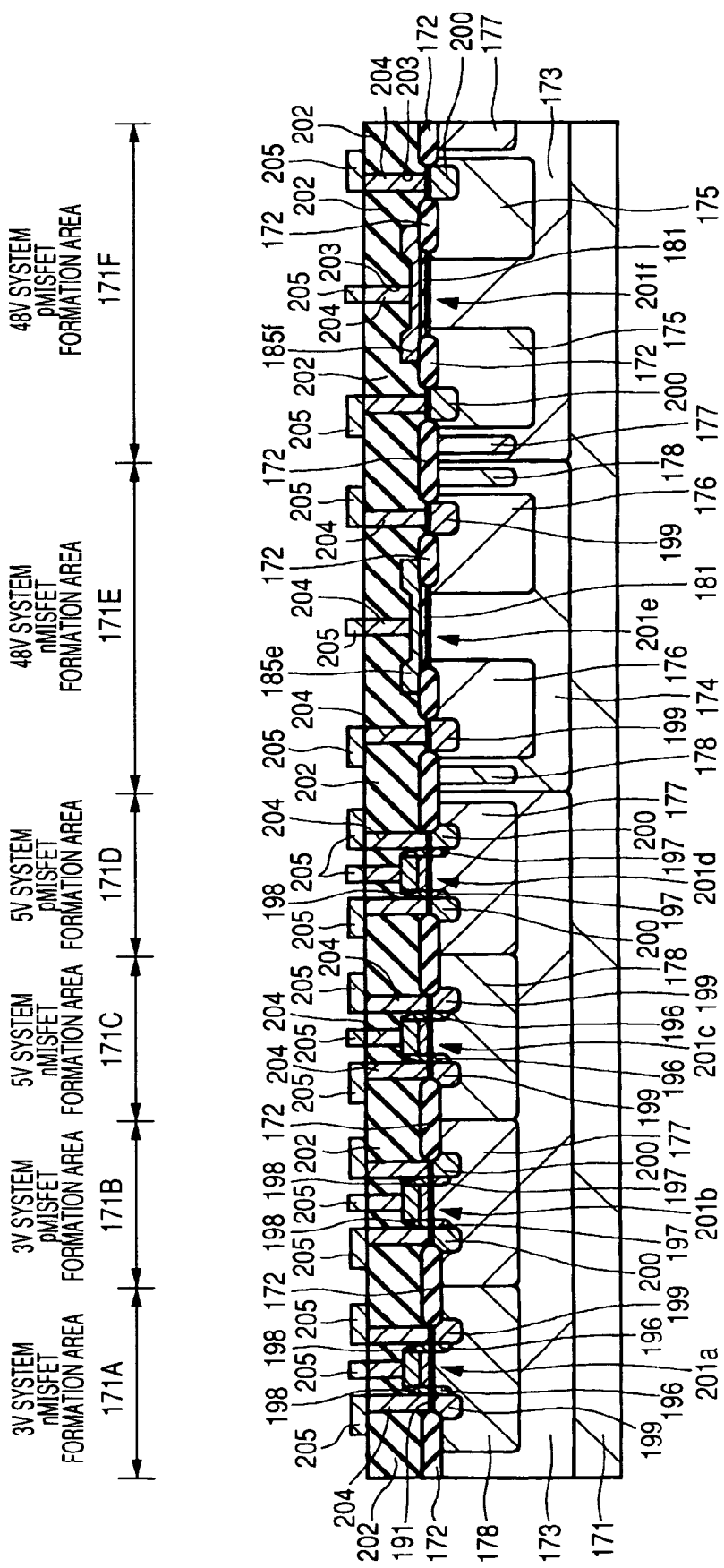
FIG. 37 is a fragmentary cross-sectional view of the semiconductor device during a manufacturing step following that of FIG. 36.

As illustrated in FIG. 37, n⁻ type semiconductor regions 196 are formed by implanting ions of an n type impurity into regions on both sides of each of the gate electrodes 195a and 195c in the regions 171A and 171C, respectively, while p⁻ type semiconductor regions 197 are formed by implanting ions of a p type impurity into regions on both sides of each of the gate electrodes 195b and 195d in the regions 171B and 171D, respectively. A silicon oxide film is then deposited over the semiconductor substrate 171, followed by anisotropic etching of the silicon oxide film to leave the silicon oxide film over the sidewalls of each of the gate electrodes 171a, 171b, 171c and 171d to form sidewall spacers 198.

Then, n⁺ type semiconductor regions (source and drain) 199 are formed by implanting ions of an n type impurity in regions on both sides of the each of the gate electrodes 195a and 195c and sidewall spacers 198 thereof in the regions 171A and 171D, respectively, and in regions on both sides of the gate electrode 185e in the region 171E, while p⁺ type semiconductor regions (source and drain) 200 are formed by implanting ions of a p type impurity in regions on both sides of each of the gate electrodes 195*b* and 195*d* and sidewall spacers 198 thereof in the regions 171B and 171D and in regions on both sides of the gate electrode 185*f* in the region 171F.

In such a manner, the 3V n channel MISFET 201*a*, 3V p channel MISFET 201*b*, 5V n channel MISFET 201*c*, 5V p channel MISFET 201*d*, 48V (high voltage) n channel MISFET 201*e* and 48V (high voltage) p channel MISFET 201*f* are formed in the regions 171A, 171B, 171C, 171D, 171E and 171F, respectively.

Over the semiconductor substrate 171, an insulating film (interlevel insulating film) 202 made of a film stack of a silicon nitride film and a BPSG (Boro-Phospho Silicate Glass) film is formed. By photolithography and dry etching, contact holes 203 are formed in the insulating film 202 so that they reach the $n^+$ type semiconductor regions 199, $p^+$ type semiconductor regions 200, and gate electrodes 185*e*, 185*f*, 195*a*, 195*b*, 195*c* and 195*d*. Then, plugs (for example, tungsten plug) 204 to embed the contact holes 203 are formed. An interconnect (for example, aluminum interconnect) 205 is formed over the insulating film 202 having the plugs 204 embedded therein. Steps for the formation of interlevel insulating films and upper interconnect layers then follow, but a description thereof is omitted herein.

Also in this Embodiment, similar advantages to those available by Embodiments 1 to 5 can be obtained. For example, it is possible to suppress or prevent oxidation (abnormal oxidation) of tungsten on the sidewalls of the gate electrode and thereby to suppress or prevent the destruction of the gate insulating film. Moreover, the reliability of the semiconductor device can be improved (degradation failures can be reduced) and the production yield can be improved. By this improvement in the reliability, the time necessary for the reliability evaluation test can be shortened.

Embodiment 7

In this Embodiment, description will be made of an inspection step to be performed after the formation of various semiconductor elements or semiconductor integrated circuits over a semiconductor wafer (semiconductor substrate).

Figure 38:
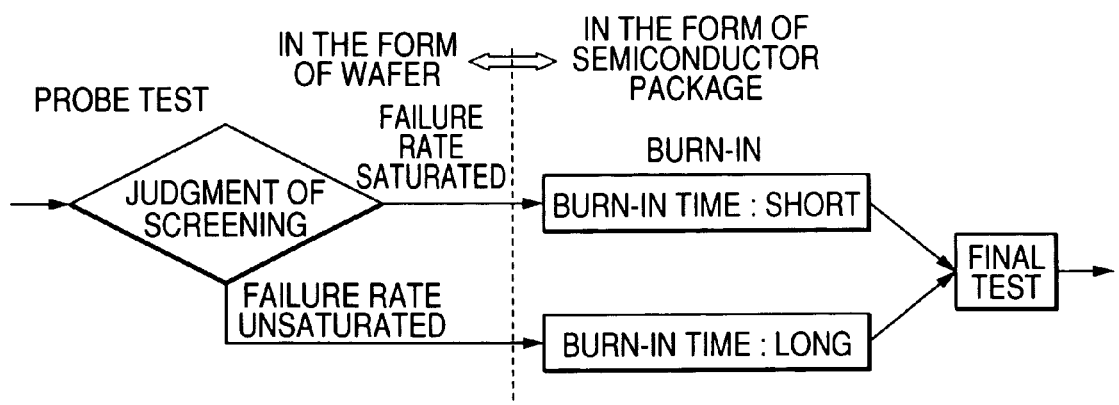
FIG. 38 is a flow diagram illustrating an inspection step after the formation of a semiconductor integrated circuit on a semiconductor wafer.
Figure 39:
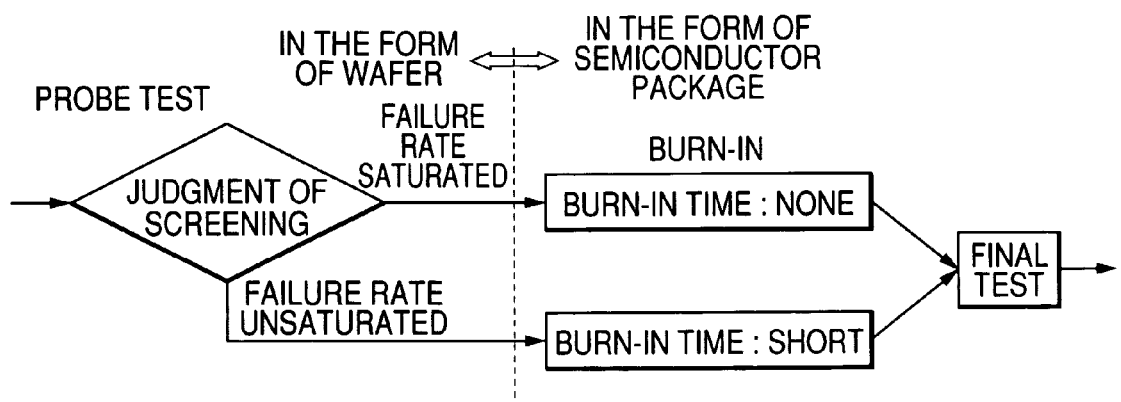
FIG. 39 is a flow diagram illustrating an inspection step after the formation of a semiconductor integrated circuit on a semiconductor wafer.
Figure 40:
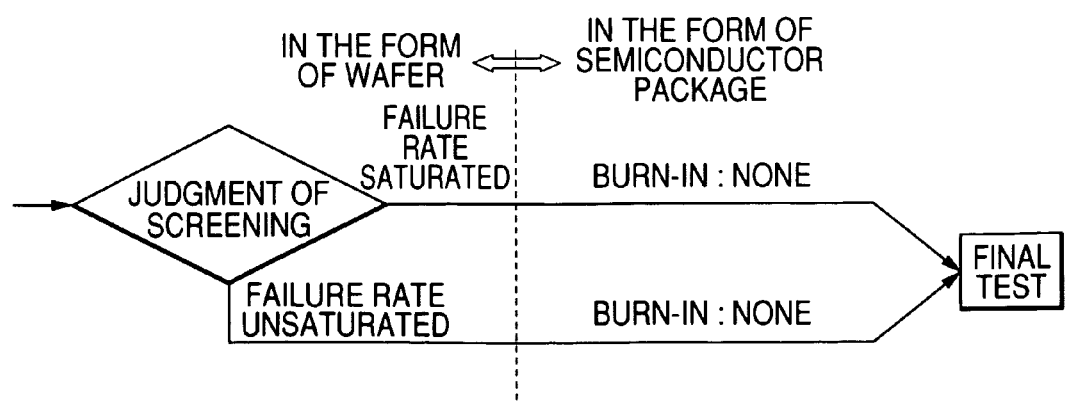
FIG. 40 is a flow diagram illustrating an inspection step after the formation of a semiconductor integrated circuit on a semiconductor wafer.

FIGS. 38 to 40 are diagrammatic views of an inspection step after the formation of various semiconductor elements or semiconductor integrated circuits over a semiconductor wafer (semiconductor substrate).

After formation of various semiconductor elements or semiconductor integrated circuits over a semiconductor wafer (semiconductor substrate) as described in connection with Embodiments 1 to 6, a probe test (test of electrical properties) is conducted by applying a test probe to a test pad electrode of the semiconductor wafer. As examples of a probe test carried out at wafer level, there are a normal temperature test (for example, a probe test under a room temperature environment), a high temperature test (for example, a probe test under a high temperature environment at about 80 to 130° C.), a low temperature test (for example, a probe test under a low temperature environment at about −40° C.) and the like. The probe test includes screening judgment (temperature and pressure stresses applied to each wafer are accelerated and early degradation failures are removed), by which a degradation mode of each chip region (a semiconductor region which will be each semiconductor chip by dicing) of a semiconductor wafer is judged.

Upon screening judgment at a wafer level, when the failure rate (percentage of chip regions judged defective among the entire chip regions of the semiconductor wafer) is saturated or the failure rate is low, the possibility of the potential inclusion of defective chip regions in the semiconductor wafer is relatively low. With a rise in the number of cycles, the failure rate increases. When the failure rate (percentage of chip regions judged defective among the entire chip regions of the semiconductor wafer) is not saturated or the failure rate is high, the possibility of the potential inclusion of defective chip regions in the semiconductor wafer is presumed to be relatively high.

After screening judgment at wafer level, the semiconductor wafer (semiconductor substrate) is cut by dicing and separated into each semiconductor chip. At this time, the semiconductor chip obtained from a chip region which has been judged as defective upon screening judgment at wafer level is eliminated as a defective product. A semiconductor chip obtained from a chip region judged non-defective upon screening judgment at wafer level is packaged. In this way, a packaged semiconductor device, that is, a semiconductor package is obtained as a product (finished product). Burn-in is then conducted, followed by final inspection. The burn-in is a method to remove defective products by applying temperature and voltage stresses on a product to be tested (a packaged semiconductor device, in this Embodiment) and then accelerating these stresses. For example, a high temperature bias test of products (packaged semiconductor devices) is conducted by applying a voltage to them under a high temperature environment (or low temperature environment) and products (packaged semiconductor devices) judged defective are eliminated. This burn-in is followed by final electrical testing.

When products (packaged semiconductor devices) to be tested are high reliability ones which are required to have high reliability such as a microcomputer and a flash memory built-in microcomputer (flash built-in microcomputer) (for example, the semiconductor device of Embodiment 4 used for automobiles or industrial uses), the burn-in time of the products (packaged semiconductor devices) manufactured from a semiconductor wafer showing saturation in a failure rate upon wafer-level screening judgment is made relatively shorter; and that of the products (packaged semiconductor devices) manufactured from a semiconductor wafer showing unsaturation in a failure rate upon wafer-level screening judgment is made relatively longer, as illustrated in FIG. 38. On the other hand, when products (packaged semiconductor devices) to be tested are general ones which are not required to have so high a reliability as the above-described high reliability products, for example, the semiconductor device (DRAM) of Embodiment 5 or the semiconductor device of Embodiment 6 (semiconductor device for LCD driver), burn-in of the products (packaged semiconductor devices) manufactured from a semiconductor wafer showing saturation in the failure rate upon wafer-level screening judgment is omitted and that of the products (packaged semiconductor devices) manufactured from a semiconductor wafer showing unsaturation in the failure rate upon wafer-level screening judgment is carried out (for a relatively short time), as illustrated in FIG. 39. In this manner, the latent failure rate of the products (packaged semiconductor devices) to be shipped can be reduced.

Since the semiconductor devices manufactured as in Embodiments 1 to 6 have improved reliability, the time spent for burn-in can be reduced compared with semiconductor devices manufactured by the conventional technique. According to the investigation by the present inventors, by manufacturing semiconductor devices in accordance with Embodiments 1 to 6, highly reliable semiconductor devices can be manufactured, and particularly, degradation failures as those appearing in the burn-in can be reduced. It is therefore possible to suppress a latent failure rate of products (packaged semiconductor devices) shipped as non-defective products within a desired value of a customer, which leads to shortening of the time spent for inspection of the device and reduction in the manufacturing cost of the device.

In this Embodiment, when products (packaged semiconductor devices) to be tested are general products which do not need so high reliability as the above-described highly a reliable products, for example, a DRAM obtained in Embodiment 5 as the semiconductor device or the semiconductor device for the LCD driver obtained in Embodiment 6, burn-in of the packaged semiconductor devices can be omitted (burn-in is not performed). FIG. 40 corresponds to the burn-in-free inspection step for the DRAM or semiconductor device for the LCD driver manufactured as in Embodiment 5 or Embodiment 6.

According to the test by the present inventors, a highly-reliable semiconductor device (DRAM or semiconductor device for LCD driver) can be manufactured, particularly, degradation failures, such as those appearing in burn-in can be reduced by employing the methods as described in Embodiments 5 and 6. As illustrated in FIG. 40, it is therefore possible to suppress the latent failure rate of products shipped as non-defective products (packaged semiconductor devices) within the desired value of a customer even if burn-in of the packaged semiconductor devices is omitted (burn-in is not performed). This makes it possible to reduce the time spent for an inspection step of a semiconductor device and also the manufacturing cost of the device. Similar to a DRAM or LCD driver, even the semiconductor device (microcomputer, flash memory built-in microcomputer (flash built-in microcomputer)) according to Embodiment 4 does not need burn-in when the reliability required is not so high but as high as that of a DRAM or LCD driver.

The invention made by the present inventors has been described specifically based on some embodiments. It should however be borne in mind that the present invention is not limited to or by them. It is needless to say that it can be modified within an extent not departing from the scope of the present invention.

The method of manufacture of the semiconductor device of the present invention is effective when adapted to a manufacturing technique of a semiconductor device equipped with a MISFET having a gate electrode having a stacked structure consisting of a polycrystalline silicon film and a tungsten suicide film.

What is claimed is:

1. A manufacturing method of a semiconductor device, comprising the steps of:
   (a) providing a semiconductor substrate;
   (b) forming an insulating film over the semiconductor substrate;
   (c) forming a polycrystalline silicon film over the insulating film;
   (d) forming a $W_xSi_y$ film over the polycrystalline silicon film;
   (e) patterning the $W_xSi_y$ film and the polycrystalline silicon film; and
   (f) after the step (e), performing heat treatment, wherein the step (c) comprises sub-steps of:
   (c1) forming a second region of the polycrystalline silicon film over the insulating film; and
   (c2) forming a first region of the polycrystalline silicon film over the second region of the polycrystalline silicon film, with an impurity concentration of the first region of the polycrystalline silicon film being smaller than that of the second region of the polycrystalline silicon film,
   wherein in the step (d), the $W_xSi_y$ film is formed so as to satisfy $y/x \geq 2$, and
   wherein the $W_xSi_y$ film formed in the step (d) has a resistivity of 1000 μΩcm or greater and has a resistivity of 400 μΩcm or less after the heat treatment in the step (f).

2. A manufacturing method of a semiconductor device according to claim 1,
   wherein $W_xSi_y$ film has a resistivity falling within a range of from 200 to 300 μΩcm after the heat treatment of the step (f).

3. A manufacturing method of a semiconductor device according to claim 1,
   wherein in the step (e), a gate electrode having the patterned $W_xSi_y$ film and polycrystalline silicon film is formed.

4. A manufacturing method of a semiconductor device according to claim 1,
   wherein the heat treatment in the step (f) is performed in an oxygen-containing atmosphere.

5. A manufacturing method of a semiconductor device according to claim 1,
   wherein by the heat treatment in the step (f), a silicon-oxide-containing film is formed over the exposed surface of the polycrystalline silicon film and $W_xSi_y$ film.

6. A manufacturing method of a semiconductor device according to claim 5, further comprising a step of forming sidewall spacers over the side walls of the polycrystalline silicon film and $W_xSi_y$ film via the silicon-oxide-containing film.

7. A manufacturing method of a semiconductor device according to claim 1,
   wherein the second region of the polycrystalline silicon film comprises impurity-doped polycrystalline silicon, and
   wherein the first region of the polycrystalline silicon film comprises non-doped polycrystalline silicon.

8. A manufacturing method of a semiconductor device according to claim 1,
   wherein the step (c) further comprises the sub-step of:
   (c3) before the sub-step (c1), forming a third region of the polycrystalline silicon film over the insulating film, an impurity concentration of the third region of the polycrystalline silicon film being smaller than that of the second region of the polycrystalline silicon film, and
   wherein in the sub-step (c1), the second region of the polycrystalline silicon film is formed over the third region of the polycrystalline silicon film.

9. A manufacturing method of a semiconductor device according to claim 8,
   wherein the third region of the polycrystalline silicon film comprises non-doped polycrystalline silicon.

10. A manufacturing method of a semiconductor device according to claim 1,
    wherein thickness of the first region of the polycrystalline silicon film falls within a range of from 1 to 6% of the thickness of the polycrystalline silicon film.

11. A manufacturing method of a semiconductor device according to claim 1,
    wherein the semiconductor device is used for microcomputer, flash memory built-in microcomputer, DRAM or LCD driver,
    wherein the method further comprises after the step (f):

(g) cutting the semiconductor substrate to separate it into semiconductor chips; and (h) packaging the semiconductor chips, and wherein after the step (h), burn-in of the packaged semiconductor device is omitted.

12. A manufacturing method of a semiconductor device comprising the steps of:

(a) providing a semiconductor substrate;

(b) forming an insulating film over the semiconductor substrate;

(c) forming, over the insulating film, a first polycrystalline silicon film containing an impurity;

(d) forming, over the first polycrystalline silicon film, a second polycrystalline silicon film having a smaller impurity concentration than that of the first polycrystalline silicon film;

(e) forming, over the second polycrystalline silicon film, an $W_xSi_y$ film so as to satisfy $y/x \geq 2$;

(f) patterning the $W_xSi_y$ film, the second polycrystalline silicon film and the first polycrystalline silicon film; and (g) after the step (f), performing heat treatment.

13. A manufacturing method of a semiconductor device according to claim 12, wherein the resistivity of the $W_xSi_y$ film formed in the step (e) is 1000 μΩcm or greater and that of the $W_xSi_y$ film after the heat treatment in the step (g) is 400 μΩcm or less.

14. A manufacturing method of a semiconductor device according to claim 13, wherein the resistivity of the $W_xSi_y$ film after the heat treatment in the step (g) falls within a range of from 200 to 300 μΩcm.

15. A manufacturing method of a semiconductor device according to claim 12, wherein in the step (f), a gate electrode having the patterned $W_xSi_y$ film, second polycrystalline silicon film and first polycrystalline silicon film is formed.

16. A manufacturing method of a semiconductor device according to claim 12, wherein the heat treatment in the step (g) is conducted in an oxygen-containing atmosphere.

17. A manufacturing method of a semiconductor device according to claim 12, wherein by the heat treatment in the step (g), a silicon-oxide-containing film is formed over the exposed surface of the first polycrystalline silicon film, the second polycrystalline silicon film and $W_xSi_y$ film.

18. A manufacturing method of a semiconductor device according to claim 17, comprising a step of:

forming sidewall spacers over the side walls of the polycrystalline silicon film and $W_xSi_y$ film via the silicon-oxide-containing film.

* * * * *